United States Patent
Sakamoto et al.

(10) Patent No.: US 7,791,098 B2
(45) Date of Patent: Sep. 7, 2010

(54) NITRIDE SEMICONDUCTOR LIGHT EMITTING DEVICE

(75) Inventors: Takahiko Sakamoto, Anan (JP); Yasutaka Hamaguchi, Anan (JP)

(73) Assignee: Nichia Corporation, Anan-shi (JP)

( * ) Notice: Subject to any disclaimer, the term of this patent is extended or adjusted under 35 U.S.C. 154(b) by 146 days.

(21) Appl. No.: 12/051,679

(22) Filed: Mar. 19, 2008

(65) Prior Publication Data

US 2008/0290365 A1    Nov. 27, 2008

Related U.S. Application Data

(63) Continuation of application No. 11/092,633, filed on Mar. 30, 2005, now Pat. No. 7,358,544.

(30) Foreign Application Priority Data

Mar. 31, 2004    (JP)    ............ P 2004-107412

(51) Int. Cl.
    *H01L 33/00*    (2010.01)
(52) U.S. Cl. .............. 257/99; 257/94; 257/95; 257/E33.001
(58) Field of Classification Search ............. 257/94, 257/95, 99
    See application file for complete search history.

(56) References Cited

U.S. PATENT DOCUMENTS

| | | | |
|---|---|---|---|
| 5,990,497 A * | 11/1999 | Kamakura et al. ............. 257/94 |
| 5,990,500 A * | 11/1999 | Okazaki ....................... 257/99 |
| 6,020,602 A | 2/2000 | Sugawara et al. |
| 6,107,644 A | 8/2000 | Shakuda et al. |
| 6,221,684 B1 | 4/2001 | Sugawara et al. |
| 6,229,160 B1 | 5/2001 | Krames et al. |
| 6,281,526 B1 | 8/2001 | Nitta et al. |
| 6,323,063 B2 | 11/2001 | Krames et al. |
| 6,417,020 B2 | 7/2002 | Nitta et al. |
| 6,570,190 B2 | 5/2003 | Krames et al. |

(Continued)

FOREIGN PATENT DOCUMENTS

EP    0622858 A2    11/1994

(Continued)

OTHER PUBLICATIONS

Office Action dated Sep. 13, 2006 issued by the USPTO in parent U.S. Appl. No. 11/092,633.

(Continued)

*Primary Examiner*—Wai-Sing Louie
(74) *Attorney, Agent, or Firm*—Birch, Stewart, Kolasch & Birch, LLP

(57) ABSTRACT

A nitride semiconductor light emitting device comprising an n-side nitride semiconductor layer and a p-side nitride semiconductor layer formed on a substrate, with a light transmitting electrode 10 formed on the p-side nitride semiconductor layer, and the p-side pad electrode 14 formed for the connection with an outside circuit, and the n-side pad electrode 12 formed on the n-side nitride semiconductor layer for the connection with the outside circuit, so as to extract light on the p-side nitride semiconductor layer side, wherein taper angles of end faces of the light transmitting electrode 10 and/or the p-side nitride semiconductor layer are made different depending on the position.

17 Claims, 15 Drawing Sheets

U.S. PATENT DOCUMENTS

| | | |
|---|---|---|
| 6,784,463 B2 | 8/2004 | Camras et al. |
| 6,809,340 B2 * | 10/2004 | Kato et al. .................... 257/79 |
| 6,946,309 B2 | 9/2005 | Camras et al. |
| 6,946,788 B2 | 9/2005 | Suehiro et al. |
| 6,956,245 B2 | 10/2005 | Senda et al. |
| 7,121,925 B2 | 10/2006 | Hashimura et al. |
| 7,268,371 B2 | 9/2007 | Krames et al. |
| 2001/0038103 A1 | 11/2001 | Nitta et al. |
| 2003/0025212 A1 | 2/2003 | Bhat et al. |
| 2003/0205712 A1 | 11/2003 | Bhat et al. |
| 2004/0026702 A1 | 2/2004 | Yamada et al. |
| 2004/0140473 A1 | 7/2004 | Chen |
| 2004/0266043 A1 | 12/2004 | Oohata et al. |
| 2005/0052878 A1 | 3/2005 | Yamada et al. |
| 2006/0192247 A1 | 8/2006 | Urashima et al. |
| 2006/0231852 A1 | 10/2006 | Kususe et al. |

FOREIGN PATENT DOCUMENTS

| | | |
|---|---|---|
| EP | 0952617 A1 | 10/1999 |
| EP | 1256987 A2 | 11/2002 |
| EP | 1396891 | 3/2004 |
| EP | 1406314 A2 | 4/2004 |
| EP | 1450415 A2 | 8/2004 |
| JP | 06-314822 | 11/1994 |
| JP | 06-388632 | 12/1994 |
| JP | 07-045867 | 2/1995 |
| JP | 07-094782 | 4/1995 |
| JP | 07-094783 | 4/1995 |
| JP | 07-106633 | 4/1995 |
| JP | 07-111339 | 4/1995 |
| JP | 07-221103 | 8/1995 |
| JP | 07-254733 | 10/1995 |
| JP | 10-032189 | 2/1998 |
| JP | 10-098211 | 4/1998 |
| JP | 10-144962 | 5/1998 |
| JP | 10-173230 | 6/1998 |
| JP | 10-173234 | 6/1998 |
| JP | 10-178203 | 6/1998 |
| JP | 10-209495 | 8/1998 |
| JP | 10-209497 | 8/1998 |
| JP | 10-209498 | 8/1998 |
| JP | 10-209499 | 8/1998 |
| JP | 10-209507 | 8/1998 |
| JP | 10-409494 | 8/1998 |
| JP | 10-247747 | 9/1998 |
| JP | 10-275933 | 10/1998 |
| JP | 10-321908 | 12/1998 |
| JP | 10-341035 | 12/1998 |
| JP | 11-163403 | 6/1999 |
| JP | 11-214749 | 8/1999 |
| JP | 11-330559 | 11/1999 |
| JP | 2001-284290 | 10/2001 |
| JP | 2002-353504 A | 12/2002 |
| JP | 2003-069077 | 3/2003 |
| JP | 2003-110136 | 4/2003 |
| JP | 2003-110138 | 4/2003 |
| JP | 2004-006662 | 1/2004 |
| JP | 2004-056088 | 2/2004 |
| JP | 2004-071644 | 3/2004 |
| JP | 2004-228554 | 8/2004 |
| JP | 2005-101212 | 4/2005 |
| WO | WO-03/007390 A1 | 1/2003 |
| WO | WO-2004-023569 | 3/2004 |

OTHER PUBLICATIONS

Office Action dated May 14, 2007 issued by the USPTO in parent U.S. Appl. No. 11/092,633.

Notice of Allowability dated Nov. 28, 2007 issued by the USPTO in parent U.S. Appl. No. 11/092,633.

* cited by examiner

NITRIDE SEMICONDUCTOR LIGHT EMITTING DEVICE

This application is a Continuation of application Ser. No. 11/092,633 now U.S. Pat. No. 7,358,544, filed on Mar. 30, 2005, which claims priority under 35 U.S.C. 119 based on application JP 2004-107412 filed in Japan on Mar. 31, 2004, the entire contents of which are hereby incorporated by reference and for which priority is claimed under 35 U.S.C. 120.

FIELD OF THE INVENTION

The present invention relates to a nitride semiconductor light emitting device, comprising nitride semiconductor represented by a general formula $In_xAl_yGa_{1-x-y}N$ ($0 \leq x \leq 1$, $0 \leq y < 1$) and, more particularly, to a small-sized nitride semiconductor light emitting device having pad electrodes occupying a large proportion of the surface area provided for connection with an external circuit.

BACKGROUND OF THE INVENTION

In an ordinary nitride semiconductor light emitting device, at least an n-side nitride semiconductor layer and a p-side nitride semiconductor layer are formed on a substrate made of sapphire, SiC, GaN or the like, and current is supplied to flow from the p-side to the n-side semiconductor layer, thereby to emit light. Formed on the p-side nitride semiconductor layer is a p-side pad electrode to be connected with a positive lead of an external power supply by wire bonding or the like, and formed on the n-side nitride semiconductor layer is an n-side pad electrode to be connected with a negative lead of the external power supply. In case an insulating substrate such as sapphire is used, a part of the p-side nitride semiconductor layer is removed to expose the n-side nitride semiconductor layer whereon the n-side pad electrode is formed. In case an electrically conductive substrate such as SiC or GaN is used, the n-side pad electrode is formed directly on the back of the substrate.

In such a nitride semiconductor light emitting device as described above, it is a common practice to form a light transmitting electrode as a light emerging surface on the p-side nitride semiconductor layer so as to spread the current uniformly over the p-side nitride semiconductor layer (for example, Patent Document 1 or 2). The light transmitting electrode is formed over substantially the entire surface so as to spread the current to the entire p-side nitride semiconductor layer, and is formed from a light transmitting material such as thin metal film so as not to obstruct light.

[Patent Document 1] Japanese Unexamined Patent Publication (Kokai) No. 6-338632

[Patent Document 2] Japanese Unexamined Patent Publication (Kokai) No. 10-144962

SUMMARY OF THE INVENTION

In the nitride semiconductor light emitting device as described above, since the p-side pad electrode and the n-side pad electrode are opaque to light, light is emitted from the top surface of the p-side nitride semiconductor layer from which the p-side pad electrode and the n-side pad electrode are removed. As the nitride semiconductor light emitting device becomes smaller in size, the p-side pad electrode and the h-side pad electrode occupy a larger proportion of the surface area of the chip, thus giving rise to the problem of maintaining external quantum efficiency. Specifically, since the p-side pad electrode and the n-side pad electrode must have a certain size that allows connection by wire bonding or the like, size of the electrodes remains substantially the same while the chip size decreases. As a result, larger proportion of the surface area is blocked by the p-side pad electrode and the n-side pad electrode as the chip size decreases, thus making it difficult to efficiently extract the light generated in the semiconductor layer.

An object of the present invention is to provide a nitride semiconductor light emitting device, comprising a light transmitting electrode and a p-side pad electrode formed on a p-side nitride semiconductor layer so as to emit light through the light transmitting electrode, that has a novel device structure enabling it to extract light efficiently.

In the nitride semiconductor light emitting device that comprises the light transmitting electrode and the p-side pad electrode formed on the p-side nitride semiconductor layer so as to emit light through the light transmitting electrode, distribution of light in the light emerging surface is determined by such factors as the arrangement of the p-side pad electrode and the n-side pad electrode that supply the current and the shapes of the light transmitting electrode and the p-side nitride semiconductor layer that dictate the area from which the light is emitted. At distal end portions located away from the p-side pad electrode and the n-side pad electrode, in particular, intensity of light emission tends to be lower because of less current flowing therein. Since the decreasing size of the chip results in smaller area of light emitting region, effect of the lower light intensity at the distal end portions becomes relatively greater. The inventors of the present application made the present invention by finding that the problem of lower light intensity at the distal end portions can be mitigated by decreasing the taper angles of end faces of the light transmitting electrode and of the p-side nitride semiconductor layer.

Specifically, the nitride semiconductor light emitting device according to the present invention has such a constitution as the n-side nitride semiconductor layer and the p-side nitride semiconductor layer are formed on the substrate, provided with a light transmitting electrode formed on the p-side nitride semiconductor layer, a p-side pad electrode formed for the connection with an external circuit and a n-side pad electrode formed on the n-side nitride semiconductor layer for the connection with the external circuit, wherein light is extracted from the p-side nitride semiconductor layer side and the taper angles of end faces of the light transmitting electrode and/or the p-side nitride semiconductor layer are varied depending on the position.

According to the present invention, efficiency of extracting light at the distal end portions can be increased and more uniform light emission can be achieved by varying the taper angles of end faces of the light transmitting electrode and/or the p-side nitride semiconductor layer depending on the position. For example, efficiency of extracting light at the distal end portions can be increased and more uniform light emission can be achieved by decreasing the taper angles of the distal end faces of the light transmitting electrode and/or the p-side nitride semiconductor layer in the end portions where the current decreases and therefore intensity of light emission decreases depending on the positional relationship with the p-side pad electrode and the n-side pad electrode. The mechanism behind the fact that the decrease in the intensity of light emission can be mitigated by decreasing the taper angles of the end faces of the light transmitting electrode and/or the reside nitride semiconductor layer at the distal end portions, is on the one hand that multiple reflections can be suppressed by varying the reflection angles at the end faces for the components of light that propagate horizontally while making multiple reflections within the semiconductor layer and, on the other hand, light ray directed from the end face upward (toward the light emerging surface) can be increased. Such an effect of the present invention becomes more conspicuous as the chip size decreases. That is, as the chip becomes smaller, proportion of the end faces to the light emitting area increases, and therefore the effect of controlling the taper angles of the end faces becomes more remarkable.

In the present invention, the "taper angle of end face" refers to the angle between the end face (namely the side face) of the light transmitting electrode or the p-side nitride semiconductor layer and the principal plane of the substrate in the plane perpendicular to the principal plane of the substrate. "Area of the highest intensity of light emission" and "area of the lowest intensity of light emission" refer to areas having the highest and lowest luminance, respectively, in the luminance distribution over the surface of the p-side nitride semiconductor layer of the nitride semiconductor light emitting device. "Area of relatively low intensity of light emission" refers to an area having luminance lower than the average luminance of the entire surface of the p-side nitride semiconductor layer in the luminance distribution over the surface of the p-side nitride semiconductor layer of the nitride semiconductor light emitting device.

"Tapering-off shape" refers to a planar shape of which width decreases gradually to the distal end, regardless of whether the distal end is straight or rounded. With regard to the nitride semiconductor light emitting device according to the present invention, "on the top" or "on the top surface" refers to being located on the side of the p-side nitride semiconductor layer or located on the surface on the side of the p-side nitride semiconductor layer, while "on the bottom" or "on the bottom surface" refers to being located on the side of the n-side nitride semiconductor layer or located on the surface on the side of the n-side nitride semiconductor layer

DETAILED DESCRIPTION OF THE INVENTION

Now preferred embodiments of the present invention will be described with reference to the attached drawings.

Embodiment 1

Figure 1:
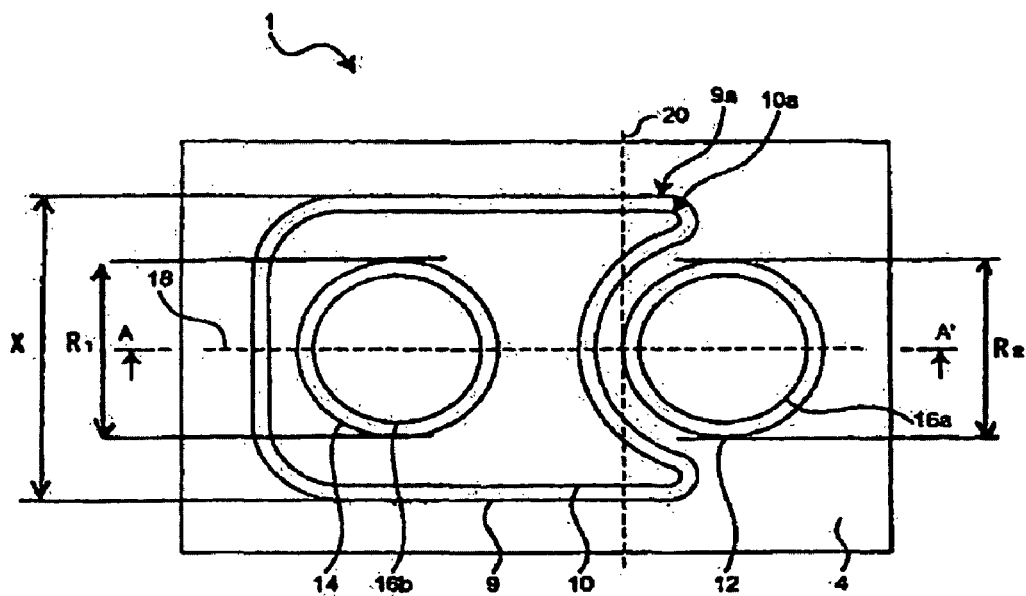
FIG. 1 is a top view of a nitride semiconductor light emitting device according to a first embodiment of the present invention.
Figure 2:
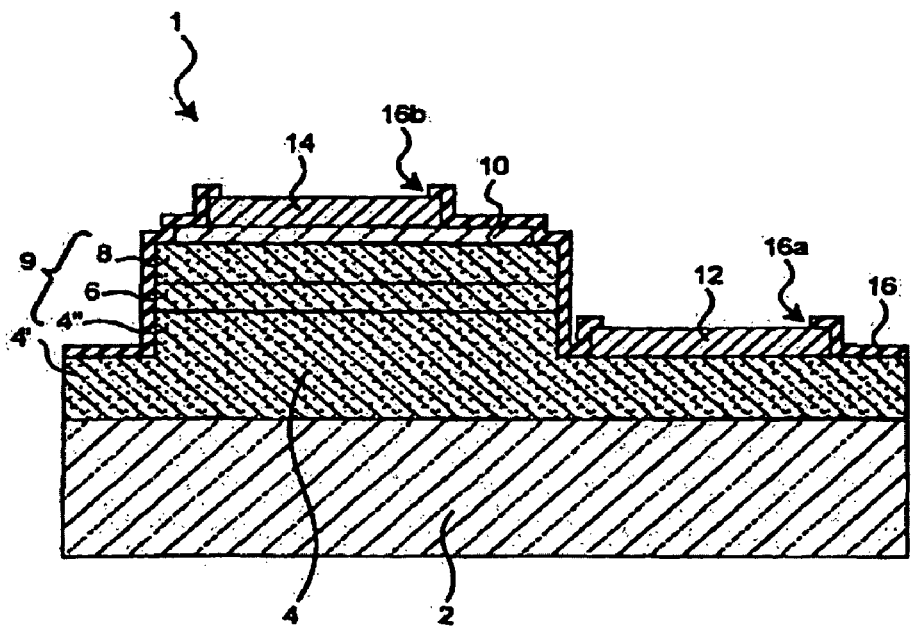
FIG. 2 is a side view taken along lines A-A' in FIG. 1.

FIG. 1 is a top view of a nitride semiconductor light emitting device according to the first embodiment of the present invention, and FIG. 2 is a sectional view thereof. As shown in FIG. 2, the nitride semiconductor light emitting device 1 comprises an n-side nitride semiconductor layer 4, an active layer 6 and a p-side nitride semiconductor layer 8 formed successively on a substrate 2 made of sapphire, SiC, Si, GaN or the like, and has double hetero-junction structure. A light transmitting electrode TO is formed from ITO or thin metal film over substantially the entire surface of the p-side nitride semiconductor layer 8, and a p-side pad electrode 14 is formed on the light transmitting electrode 10 for the connection with an external circuit by wire bonding or the like.

On the other hand, to form an n-side pad electrode 12, top portions 4'' of the p-side nitride semiconductor layer 8, the active layer 6 and the n-side nitride semiconductor layer are removed so as to expose the surface of a bottom portion 4' of the n-side nitride semiconductor layer. In the descriptions hereinafter, the p-side nitride semiconductor layer 8, the active layer 6 and the n-side nitride semiconductor layer 4'' may be collectively referred to as p-side layers 9, and the bottom portion of the n-side nitride semiconductor layer may be referred to as n-side layer 4'. The n-side pad electrode 12 is formed on the surface of the n-side layer 4' that has been exposed. The entire top surface of the nitride semiconductor light emitting device 1 is covered by an insulation film 16 such as $SiO_2$ for protection. The insulation film 16 has apertures 16a and 16b so as to expose part of the n-side pad electrode 12 and the p-side pad electrode 14.

When current is supplied to flow from the p-side pad electrode 14 to the n-side pad electrode 12, the current drawn from the p-side pad electrode 14 is caused by the light transmitting electrode 10 to spread over substantially the entire surface of the p-side nitride semiconductor layer 8, and flow through the active layer 6 and the n-side nitride semiconductor layer 4 to the n-side pad electrode 12. As a result, light, is emitted in the active layer 6 and is extracted from the top surface side of the substrate through the light transmitting electrode TO. Since the light emitted in the active layer 6 propagates in the horizontal direction, the entire surface of the p-side nitride semiconductor layer 8 (namely the entire surface of the p-side layers 9) illuminates when viewed from above the substrate.

Top view of the nitride semiconductor light emitting device 1 is shown in FIG. 1. The p-side layer 9 is formed in a substantially rectangular island shape having a notch of arc shape on one side thereof, while the light transmitting electrode 10 is formed over substantially the entire top surface. Provided at a position to the left of the center on the light transmitting electrode 10 is the p-side pad electrode 14. The n-side pad electrode is provided on the n-side layer 4' along the arc-shaped notch of the p-side layer 9.

In the nitride semiconductor light emitting device having such a configuration as described above, intensity of light emission tends to decrease at the end portions that are located away from the passage of current that flows from the p-side pad electrode 14 to the n-side pad electrode 12. Assume a centerline 18 that connects the center of the p-side pad electrode 14 and the center of the n-side pad electrode and a tangent line 20 of the n-side pad electrode 12 that crosses the centerline 18 at right angles, as shown in FIG. 1. Then, the intensity of light emission tends to be lower in a region located on the opposite side of the p-side pad electrode 14 across the tangent line 20. In this embodiment, therefore, the p-side layer 9a and the light transmitting electrode 10a located in this region are formed with smaller taper angle of the end faces thereof, thereby to suppress the decrease in the intensity of light emission.

Figure 3A:
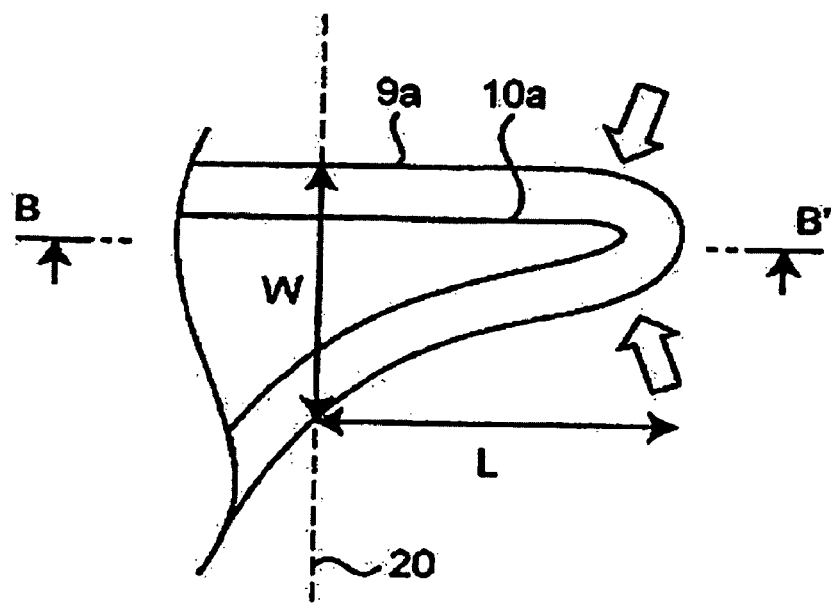
FIG. 3A is a partially enlarged top view of the nitride semiconductor light emitting device shown in FIG. 1.
Figure 3B:
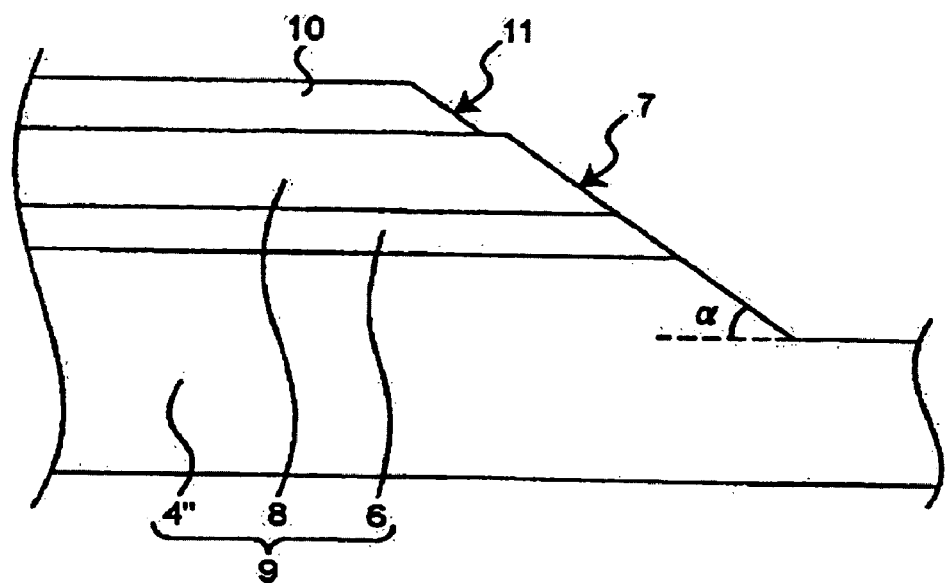
FIG. 3B is a partially enlarged sectional view of the nitride semiconductor light emitting device shown in FIG. 1.

While the taper angle can be controlled by adjusting the masking conditions (sectional configuration of the mask, material of the mask, selection of etching gas, etc.) employed during etching, in this embodiment the taper angle is controlled by forming the end portions of the p-side layer 9 and the light transmitting electrode 10 in tapering-off planar shape such that width decreases gradually to the distal end. FIG. 3A and FIG. 3B are plan view and sectional view, respectively, schematically showing the configuration of the p-side layer 9a and the light transmitting electrode 10a located in the region described above. As shown in FIG. 3A, the p-side layer 9a located outside the tangent line 20 of the n electrode has such a planar shape as the width W thereof gradually decreases toward the end, while the light transmitting electrode 10a also has a similar shape. When the p-side layer 9 having such a planar shape is etched, the angle of the end face becomes smaller due to the following two effects. First while the edge of an ordinary shape is etched vertically, etching of the p-side layer that tapers off toward the distal end proceeds on both sides of the narrowing end portion as shown in FIG. 3A so that the etched end face is inclined. Second, while the mask that covers the top surface of the p-side layer 9 during etching is etched away at a certain rate, the mask on the portion of the p-side layer where it tapers off also tapers off toward the end and the mask is less likely to be etched away on the portion having the tapering-off shape. As a result, the end face is more likely to be inclined in the portion that has tapering-off shape. This applies also to a case where the light transmitting electrode 10a is formed in a tapering-off shape.

In order to decrease the taper angle of the end face by tapering off the light transmitting electrode or the p-side layer 9 in the end portion thereof, both sides of the end portion as approximated as a triangle forms an angle of less than 90 degrees, preferably 45 degrees or less and more preferably 30 degrees or less. Alternatively, a ratio of die width W of the end portion to the distance L of the end of the end portion from the tangent line 20, W/L, may be adjusted instead of the angle described above. In this case, it is preferable to adjust the value of W/L while fixing the value of L (for example, to 10 μm). Value of W/L is preferably 1.8 or less, more preferably 1.4 or less in order to control the taper angle of the end face within a desirable range.

At the end portions of the p-side layer 9 and the light transmitting electrode 10 formed in tapering-off shape, the taper angle α becomes relatively small, as shown in FIG. 3B. When the taper angle α becomes smaller, multiple reflections can be suppressed by varying the reflection angles at the end faces for the components of light that propagate horizontally while making multiple reflections, within the semiconductor layer and light ray directed from the end face upward (toward the light emerging surface) can be increased, thereby improving the intensity of light emission in the distal end portion. This effect will be described in detail below with reference to FIG. 4A and FIG. 4B.

Figure 4A:
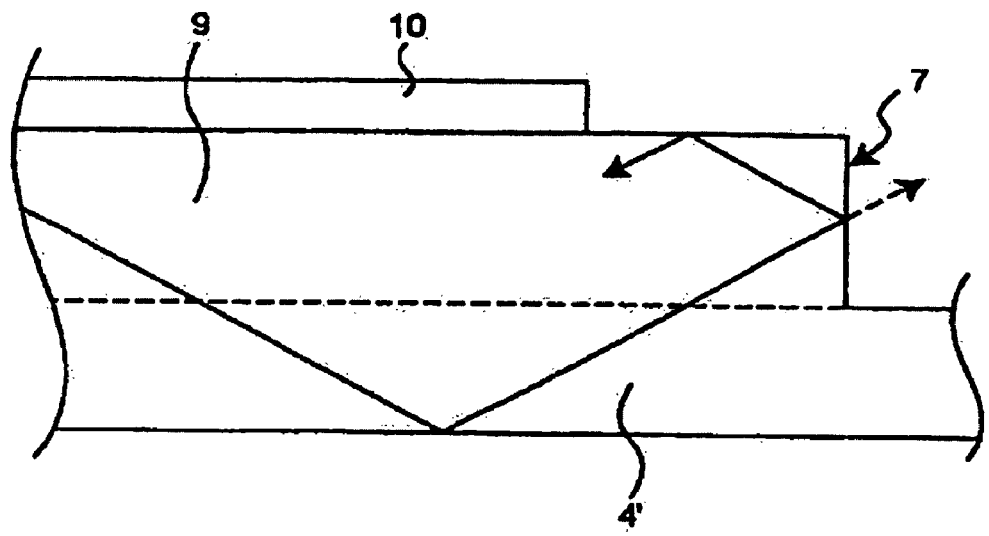
FIG. 4A is a schematic diagram indicating an optical path when end faces of a light transmitting electrode and a p-side layer are vertical.
Figure 4B:
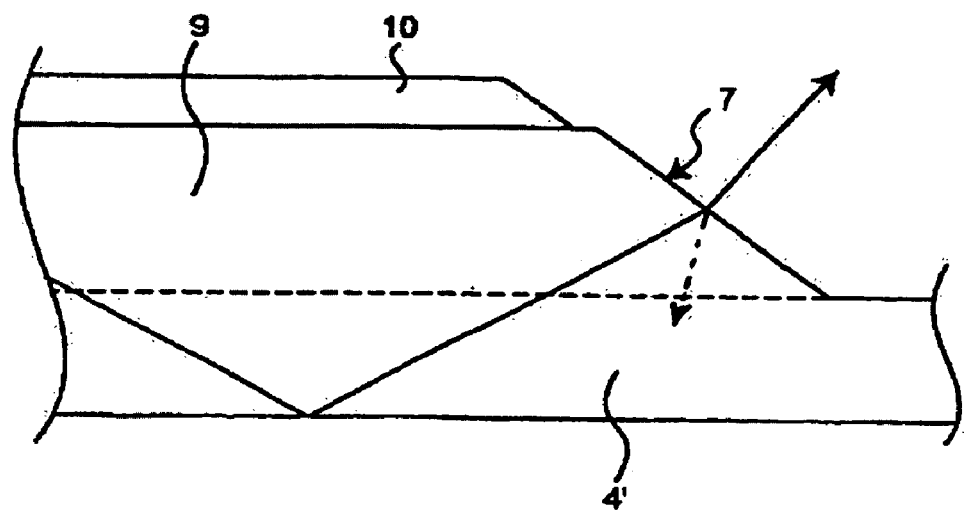
FIG. 4B is a schematic diagram indicating an optical path when the end faces of the light transmitting electrode and a p-side layer are inclined.

FIG. 4A shows a case where the end faces of the p-side layer 9 and the light transmitting electrode 10 are formed to be vertical as in the prior art, and FIG. 4B shows a case where the end face is inclined with a small angle. While light generated in the semiconductor layer is extracted on the p-side nitride semiconductor layer side through the light transmitting electrode in the nitride semiconductor light emitting device, as described previously, weak optical waveguide is formed due to the difference in refractive index between the layers which causes a component of light that propagates in the horizontal direction while making multiple reflections. In the conventional nitride semiconductor light emitting device, multiple reflections are apt to occur in the nitride semiconductor layer because the nitride semiconductor layer has a higher refractive index than the substrate and the light transmitting electrode 10 have. In case the p-side layer 9 has a substantially vertical end face 7 as shown in FIG. 4A, light that propagates in the horizontal direction while making multiple reflections at such an angle of incidence that causes total reflection reaches the end face 7 with a relatively large angle of incidence. Since the end face is perpendicular to the substrate surface, light reflected on the end face 7 returns into the semiconductor layer with the same angle, thus repeating multiple total reflections. Since the semiconductor layer has a high optical absorptivity, the light attenuates while making multiple reflections. Moreover, since light that has leaked from the end face without being reflected is radiated in the horizontal direction, it has relatively less contribution to the optical output power. In case the end face 7 of the p-side layer is inclined with a small angle as shown in FIG. 4B, in contrast, light that propagates in the horizontal direction while making multiple reflections at such an angle of incidence that causes total reflection reaches the end face 7 with a relatively small angle of incidence, and is therefore transmitted and extracted to the outside at a high ratio. In this case, since a large part of the extracted light is directed upward from the substrate, it contributes efficiently to the optical output power. Light reflected oh the end face 7 is also efficiently extracted to the outside from the top surface or the bottom surface of the substrate, since it is reflected so as to have smaller angle of incidence to the substrate surface.

As described above, decreasing the taper angle of the end face of the p-side layer 9 results in a higher efficiency of extracting light and a higher intensity of light emission at the portion. While the p-side layer 9 includes, the p-side nitride semiconductor layer 8, the active layer 6 and the n-side nitride semiconductor layer 4" as shown in FIG. 3B, the effect described above can be achieved when the taper angle of the end face of at least the p-side nitride semiconductor layer 8 (or the p-side nitride semiconductor layer 8 and the active layer 6) is controlled to a small value. Although the effect of forming the end face of the p-side layer 9 with a small taper angle has been described, similar effect can be obtained also by forming the end face of the light transmitting electrode 10 with a small taper angle. Since the light transmitting electrode 10 has a refractive index higher, than that of the air that makes contact therewith, and therefore another optical waveguide is formed from the light transmitting electrode 10 and the semiconductor layer. Since a phenomenon similar to that described above occurs also when the light that propagates horizontally through the optical waveguide reaches the end face of the light transmitting electrode 10, decreasing the taper angle of the end face of the light transmitting electrode 10 leads to an increased intensity of light emission at that portion.

The taper angles of the end faces of the light transmitting electrode and of the p-side nitride semiconductor layer are preferably 70 degrees or less, more preferably 60 degrees and most preferably 50 degrees or less. The taper angle of the end face can be controlled, for example, by shaping the distal end portions of the p-side layer 9 and the light transmitting electrode 10 in tapering-off planar shape. In that case, the taper angle becomes smaller as the angle formed by both sides of the end portion, which can be approximated as a triangle, is made smaller (or the value of W/L is made smaller). The taper angle can be controlled also by adjusting the etching conditions. For example, when the mask used for etching the p-side nitride semiconductor layer has an inclined end face, the taper angle of the p-side nitride semiconductor layer becomes smaller as the taper angle of the mask edge is made smaller. (When the nitride semiconductor layer is etched to a depth of 1.5 μm, for example, the taper angle of about 45 degrees can be given to the end face of the nitride semiconductor layer by forming the end face of the etching mask with a taper angle of about 30 degrees.) Since the taper angle can be changed also by changing the rate of etching the p-side nitride semiconductor layer 8, the taper angle can be, controlled by appropriately setting the etching rate according to the empirically determined relationship.

Figure 5:
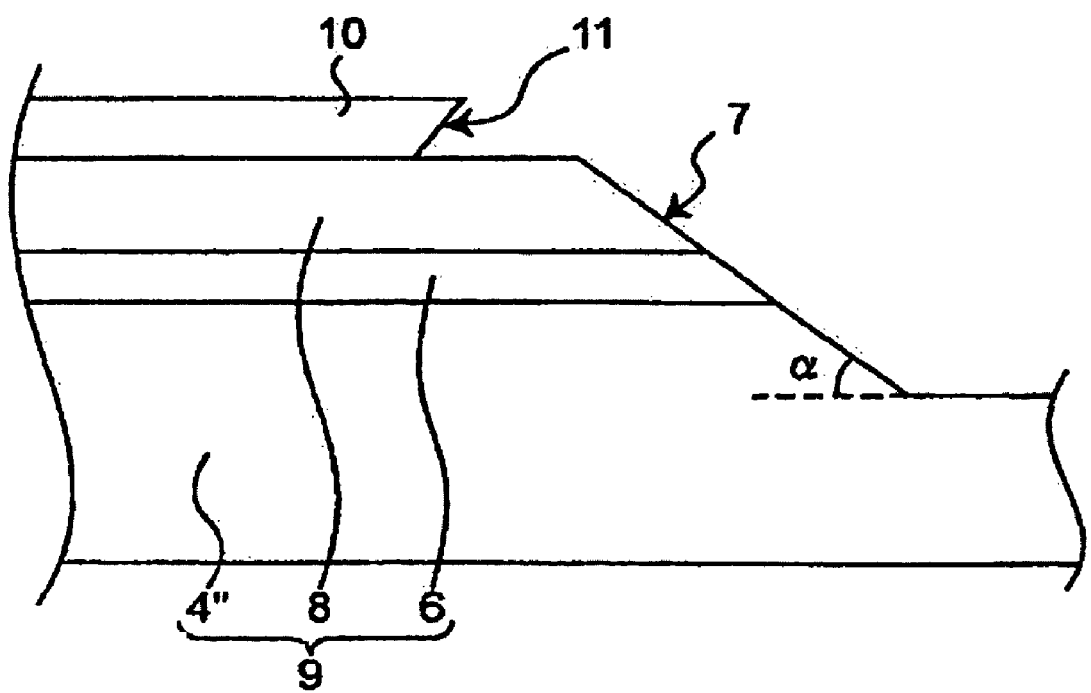
FIG. 5 is a sectional view showing another variation of that shown in FIG. 3B.

In a region of relatively high intensity of lighten taper angles of the end faces of the light transmitting electrode 10 and of the p-side nitride, semiconductor, layer 8 are preferably 70 degrees or more. In a region of relatively high intensity of light emission as shown in FIG. 5, in particular, the taper angle of the end face 11 of the light transmitting electrode 10 is preferably an obtuse angle larger than 90 degrees. In this case, the end face 11 of the light transmitting electrode 10 becomes an overhang. The overhang here means the end face 11 of the light transmitting electrode 10 being inclined so as to protrude outward at the top. When the taper angle of the end face 11 of the light transmitting electrode 10 is made an obtuse angle in a region of relatively high intensity of light emission, concentration of emitted light at the end face can be mitigated and uniformity of light emission can be improved.

The effect of controlling the end face taper angle described above becomes more conspicuous as the device becomes further smaller. This is because a higher proportion of light is blocked by the p-side pad electrode and the n-side pad electrode as the device becomes smaller, so that the light emitted through the end face makes more contribution to the total light emission. In other words, the effect of controlling the end face taper angle becomes conspicuous in such devices as follows:

(1) A light emitting device where width X of the p-side layer 9 connected with the p-side pad electrode 14 (which is equal the width of the p-side nitride semiconductor layer 8) and the maximum width $R_p$ of the p-side pad electrode 14 in the direction of shorter side of the substrate satisfy a relation of inequality $X<2R_p$, as shown in FIG. 1.

(2) More preferably a light emitting device where the maximum width $R_n$ of the n-side pad electrode 12 in the direction of shorter side of the substrate satisfies a relation of inequality $X<2R_n$.

The effect of controlling the end face taper angle can be conspicuously achieved with a device where total area of the p-side pad electrode 14 and the n-side pad electrode 12 occupies 20% or more of the device surface area.

Assuming the centerline 18 that connects the center of the p-side pad electrode 14 and the center of the n-side pad electrode 12 and the tangent line 20 of the n-side pad electrode 12 that crosses the centerline 18 at right angles (the tangent line nearer to the p-side pad electrode 14, the same applies to other embodiments), it is advantageous in view of the layout of the electrodes of a chip of decreasing size, to form the distal end portions 9a and 10a having a shape that tapers off in the region located on the opposite side of the p-side pad electrode 14 across the tangent line 20, as in this embodiment. That is, since the total area of the p-side pad electrode 14 and the n-side pad electrode 12 occupies a greater proportion of the surface area of the chip as the chip becomes smaller, the area where the p-side layer 9 (and the light transmitting electrode 10) can be formed, as the light emitting region, becomes narrower. In order to carry out wire bonding, for example, it is necessary to form the p-side pad electrode 14 and die n-side pad electrode 12 in certain sizes (for example, 70 μm in diameter). As smaller chips are commercialized, commercial production of a chip as small as 250 μm by 150 μm is planned, which results in a substantially high proportion of surface area occupied by the p-side pad electrode 14 and the n-side pad electrode 12 as shown in FIG. 1. Since it is necessary to form the p-side layer 9 and the light transmitting electrode 10 away from at least the n-side pad electrode 12 and at a certain distance from the periphery of the chip, the area available for forming the p-side layer 9 and the light transmitting electrode 10 is very small. Particularly the clearance between the n-side pad electrode 12 and the periphery of the chip is so small that the p-side layer to be formed therein becomes thin and long. Further, since the area between the n-side pad electrode and the periphery of the chip is located away from the current path that flows from the p-side pad electrode to die n-side pad electrode, it is difficult for current to flow therein in die first place, and it becomes even more difficult when the area becomes narrower. By forming the distal end portion so as to taper off, it is made possible to form the p-side layer with a sufficient width in the narrower area while suppressing the decrease of the intensity of light emission in the portion.

Now a method for manufacturing a nitride semiconductor light emitting device according to the present invention will be described below. With regards to aspects other than those described below, the method is the same as the method of manufacturing a conventional nitride semiconductor light emitting device. Specific composition and thickness will be described for each of the necessary layers for reference, which must not be regarded as restrictive. The description that follows assumes that the nitride semiconductor layer is etched to a depth of 1.5 μm to expose the n-side nitride semiconductor layer.

First, the n-side nitride semiconductor layer 4, the active layer 6 and the p-side nitride semiconductor layer 8 are formed one on another on the substrate 2, followed by the formation of a mask on the semiconductor layer. The mask may be made of a photo resist, $SiO_2$ or the like. When the mask is made of $SiO_2$, it is formed into a predetermined pattern by photolithography using a resist. By reactive ion etching (RIE) using the mask, the p-side nitride semiconductor layer 8, the active layer 6 and a part 4" of the n-side nitride semiconductor layer are removed so as to expose the surface of the n-side nitride semiconductor layer 4.

At this time, by forming the end portion that tapers off in the planar configuration of the mask made of $SiO_2$ or the like, the taper angle is controlled for the end face of the p-side layer 9 (the p-side nitride semiconductor layer 8, the active layer 6 and the n-side nitride semiconductor layer 4") in that portion. The taper angle of the end face of the p-side layer 9 may be controlled, in addition to the above, by decreasing the taper angle of the end face of the mask made of $SiO_2$ or the like at a desired portion. Even in other portions that do not taper off, the end face of the semiconductor layer can be inclined, for example, by about 45 degrees through RIE or other etching process, by inclining the end face of the $SiO_2$ mask by about 30 degrees at a position where an inclined end face is required. The taper angle of the end face of the $SiO_2$ mask can also be controlled by controlling the taper angle of the end face of the resist film used for patterning the $SiO_2$ mask, which in turn can be achieved by controlling the sintering temperature and the developing time of the resist. When the sintering temperature of the resist is made higher and the developing time of the resist is made longer, taper angle of the resist tends to become smaller.

After removing the $SiO_2$ mask, the light transmitting electrode 10 is formed and is patterned by a similar method. Then the n-side pad electrode 10, the p-side pad electrode 14 and the insulation film are formed, and the entire surface of the chip is covered with the insulation film 16. Apertures 16a and 16b are formed in the insulation film 16. Last, the substrate 2 is separated into chips so as to complete the nitride semiconductor light emitting device.

Components of the nitride semiconductor light emitting device according to this embodiment of the present invention will now be described in detail below.

Translucent Electrode 10

The light transmitting electrode may be made of a metal that contains at least one element selected from a group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag) and yttrium (Y), or an alloy, a laminated structure or a compound thereof. When a metal or an alloy is used, it can be formed in a thin film mat transmits light. Compounds include oxide, nitride or the like that has electrical conductivity. Metal oxides having electrical conductivity (oxide semiconductors) include electrically conductive oxide film that contains at least one element selected from a group consisting of zinc, indium, tin and magnesium, specifically indium oxide doped with tin (indium tin oxide: ITO) formed in a film of 50 Å to 10 μm in thickness, ZnO, $In_2O_3SnO_2$ or the like. These materials are particularly preferable because of high light transmission. The electrode may be formed in a shape that has opening such as rectangular grid, stripe or the like.

N-Side Pad Electrode 12, P-Side Pad Electrode 14

The n-side pad electrode 12 may be formed in various constitutions, which can be selected taking into consideration such factor as ohmic property, bonding property, prevention of impurity from diffusing and bonding with wire. For example, such a constitution may be employed as a first layer made of W, Mo, Ti, etc. that has good ohmic contact and bonding property with the n-side nitride semiconductor layer, and a second layer to make a connection pad made of gold, Al, platinum, etc. that has good property of bonding with wire, formed in succession from the side of n-side nitride semiconductor layer. For example, Ti/Au and Ti/Al may be used. Such a three-layer structure may also be employed as a layer of metal (W, Mo, platinum group) having a high melting point is provided as a barrier layer between the first layer that provides ohmic contact and the second layer that makes the connection pad, for example W/Pt/Au, Ti/Rh (second layer a)/Pt (second b)/Au. It is particularly preferable for improving the efficiency of extracting light to use Rh that has high reflectivity and high property to/act as a barrier layer. In addition to Ni/Au and Co/AU, electrically conductive oxide such as ITO, metal of platinum group, Rh/Ir, Pt/Pd or the like is preferably employed in this order from the semiconductor layer. In the semiconductor light emission device of the present invention, it is preferable to provide an extended electrode portion for the p-side pad electrode. This enables the active layer as a whole to emit light efficiently, and is particularly effective when the semiconductor light emission device of the present invention is mounted face up. The p-side pad electrode may be formed either on the light transmitting electrode or in such a manner as to make contact with the p-side nitride semiconductor layer through the opening formed in the light transmitting electrode.

N-Side Nitride Semiconductor Layer 4, Active Layer 6 and P-Side Nitride Semiconductor Layer 8.

There is no restriction on the stacked structure of the semiconductor layers that constitute the nitride semiconductor light emitting device of the present invention, while the stacked layer structures as described in (1) through (5), for example, may be employed.

The structures (1) through (5) are formed on a growth substrate, for which sapphire is preferably used.

(1) A buffer layer made of GaN having thickness of 200 Å, an n-type contact layer made of Si-doped n-type GaN having thickness of 4 μm, an active layer of single quantum well structure made of undoped $In_{0.2}Ga_{0.8}N$ having thickness of 30 Å, a p-type cladding layer made of Mg-doped p-type $Al_{0.1}Ga_{0.9}N$ having thickness of 0.2 µm, and a p-type contact layer made of Mg-doped p-type GaN having thickness of 0.5 µm.

(2) (a) A buffer layer made of AlGaN having thickness of about 100 Å, (b) an n-side first multi-layer film comprising three layers made of undoped GaN layer having thickness of 1 µm, an n-type contact layer made of GaN doped with $4.5 \times 10^{18}/cm^3$ of Si having thickness of 5 µm, a base layer made of undoped GaN having thickness of 3000 Å, an intermediate layer made of GaN doped with $4.5 \times 10^{18}/cm^3$ of Si having thickness of 300 Å and a top layer made of undoped GaN having thickness of 50 Å (total thickness 3350 Å), (c) an n-side second multi-layer film of super lattice structure comprising nitride semiconductor layers made of undoped GaN having thickness of 40 Å and semiconductor layers made of undoped $In_{0.1}Ga_{0.9}N$ having thickness of 20 Å, that are stacked alternately one on another for 10 layers each, with a nitride semiconductor layer made of undoped GaN having thickness of 40 Å formed thereon (total thickness 640 Å), (d) an active layer of multiple quantum well structure consisting of six barrier layers made of undoped GaN having thickness of 250 Å and six well layers made of $In_{0.3}Ga_{0.7}N$ having thickness of 30 Å, stacked alternately one another, with a barrier layer made of undoped GaN having thickness of 250 Å formed thereon (total thickness 1930 Å), (e) a p-side second multi-layer film of super lattice structure consisting of five nitride semiconductor layers made of $In_{0.15}Ga_{0.85}N$ containing $5 \times 10^{19}/cm^3$ of Mg having thickness of 40 Å and five nitride semiconductor layers made of $In_{0.03}Ga_{0.97}N$ containing $5 \times 10^{19}/cm^3$ of Mg having thickness of 25 Å stacked alternately one on another with a nitride semiconductor layer made of $Al_{0.15}Ga_{0.85}N$ containing $5 \times 10^{19}/cm^3$ of Mg having thickness of 40 Å formed thereon (total thickness 365 Å); and (f) a p-type contact layer made of GaN containing $1 \times 10^{20}/cm^3$ of Mg having thickness of 1200 Å.

(3) (a) A buffer layer made of AlGaN having thickness of about 100 Å, (b) An n-side first multi-layer film comprising three layers of an undoped GaN layer having thickness of 1 µm, an n-type contact layer made of GaN doped with $4.5 \times 10^{18}/cm^3$ of Si having thickness of 5 µm, a base layer made of undoped GaN having thickness of 3000 Å, an intermediate layer made of GaN doped with $4.5 \times 10^{18}/cm^3$ of Si having thickness of 300 Å and a top layer made of undoped GaN having thickness of 50 Å (total thickness 3350 Å), (c) an n-side second multi-layer film of super lattice structure consisting of 10 nitride semiconductor layers made of undoped GaN having thickness of 40 Å and 10 semiconductor layers made of undoped $In_{0.1}Ga_{0.9}N$ having thickness of 20 Å, stacked alternately one on another, with a nitride semiconductor layer made of undoped GaN having thickness of 40 Å formed thereon (total thickness 640 Å), (d) an active layer of multiple quantum well structure consisting of six well layers made of $In_{0.3}Ga_{0.7}N$ having thickness of 250 Å, six first barrier layers made of $In_{0.02}Ga_{0.98}N$ having thickness of 100 Å and six second barrier layers made of undoped GaN having thickness of 150 Å, stacked alternately (total thickness 1930 Å) (number of repetitions of alternately stacking is preferably from 3 to 6), (e) a p-side second multi-layer film of super lattice structure consisting of five nitride semiconductor layers made of $In_{0.15}Ga_{0.85}N$ containing $5 \times 10^{19}/cm^3$ of Mg having thickness of 40 Å and five nitride semiconductor layers made of $In_{0.03}Ga_{0.97}N$ containing $5 \times 10^{19}/cm^3$ of Mg having thickness of 25 Å stacked alternately with a nitride semiconductor layer made of $Al_{0.15}Ga_{0.85}N$ containing $5 \times 10^{19}/cm^3$ of Mg having thickness of 40 Å formed thereon (total thickness 365 Å); and (f) a p-type contact layer made of GaN containing $1 \times 10^{20}/cm^3$ of Mg having thickness of 1200 Å. It is made possible to suppress the value of $V_f$ from varying with the lapse of drive time of the light emitting device by forming the base layer of undoped GaN having thickness of 3000 Å, provided on the n side from a first layer of undoped GaN having thickness of 1500 Å, a second layer of GaN doped with $5 \times 10^{17}/cm^3$ of Si having thickness of 100 Å, and a third layer of undoped GaN having thickness of 1500 Å.

(4) (a) A buffer layer, (b) an undoped GaN layer, (c) an n-side contact layer made of GaN containing $6.0 \times 10^{18}/cm^3$ of Si, (d) an undoped GaN layer (the three layers described above are n-type nitride semiconductor layers having total thickness 6 nm), (e) an active layer of multiple quantum well structure consisting of five barrier layers made of GaN containing $2.0 \times 10^{18}/cm^3$ of Si and five well layers made of InGaN stacked alternately one on another and (f) a p-side nitride semiconductor layer made of GaN containing $5.0 \times 10^{18}/cm^3$ of Mg having thickness of 1300 Å. An InGaN layer having thickness of 50 Å may also be provided between the light transmitting electrode and the p-side nitride semiconductor layer. When the InGaN layer having thickness from 30 to 100 Å, preferably 50 Å is provided as described above, this layer makes contact with the positive electrode so as to act as a p-side contact layer.

(5) (a) A buffer layer, (b) an undoped GaN layer, (c) an n-side contact layer of GaN containing $1.3 \times 10^{19}/cm^3$ of Si, (d) an undoped GaN layer (the three layers described above are n-type nitride semiconductor layers having total thickness 6 nm), an active layer of multiple quantum well structure consisting of seven barrier layers made of GaN containing $3.0 \times 10^{18}/cm^3$ of Si and seven well layers made of InGaN stacked alternately one on another (thickness 800 Å) and (e) a p-side nitride semiconductor layer of GaN containing $2.5 \times 10^{20}/cm^3$ of Mg having thickness of 1300 Å. An InGaN layer having thickness of 50 Å may also be provided between the light transmitting electrode and the p-side nitride semiconductor layer. When the InGaN layer having thickness from 30 to 100 Å, preferably 50 Å is provided as described above, this layer makes contact with the positive electrode so as to act as a p-side contact layer.

Light Conversion Member

The semiconductor light emitting device of the present invention may also have a light conversion member that transforms a part of light emitted by the light emitting device into light of a different wavelength. Then a light emitting device that transforms the light emitted by die light emitting element is obtained, making possible to generate white light, light having a hue of incandescent lamp or the like by blending the light emitted by the light emitting element and the converted light.

The light converting member may be an aluminum garnet-based fluorescent material that contains Al and at least one element selected from among Y, Lu, Sc, La, Gd, Tb, Eu and Sm and at least one element selected from among Ga and In, or an aluminum garnet-based fluorescent material that contains at least one element selected from among rare earth elements. This constitution makes a light emitting device that shows good temperature characteristic and high durability even when used under such conditions as high output power and high heat generation.

The light converting member may also be/a fluorescent material represented by $(Re_{1-x}R_x)_3(Al_{1-y}Ga_y)_5O_{12}$ ($0<x\leq 1$, $0\leq y\leq 1$, Re represents at least one element selected from among Y, Gd, La, Lu, Tb and Sm, while R represents Ce, or Ce and Pr). This constitution makes a high-output light emitting device that shows good temperature characteristic and high durability, and is advantageous for emitting white light since the temperature characteristic resembles that of black body in case the active layer is made of InGaN.

The light converting member may also be an nitride-based fluorescent material that contains N and at least one element selected from among Be, Mg, Ca, Sr, Ba and Zn, at least one element selected from among C, Si, Ge, Sn, Ti, Zr and Hf, at least one element selected from among rare earth elements. Specifically, a fluorescent material represented by general formula $L_XSi_YN_{(2/3X+4/3Y)}$:Eu or $L_XSi_YO_ZN_{(2/3X+4/3Y-2/3Z)}$:Eu (L represents Sr or Ca, or Sr and Ca). This constitution, similarly to that of the fluorescent material described above, makes a high-output light emitting device that shows good temperature characteristic and high durability. Among these materials, silicon oxide nitride compound is the most preferable. When a nitride fluorescent material and aluminum garnet-based fluorescent material are used in combination, a light emitting device that has less temperature dependency of the blended light can be made due to the synergy effect of the temperature characteristics of both materials.

Embodiment 2

This embodiment, is similar to Embodiment 1 except that the substrate 2 is separated by laser scribing.

Laser scribing is a method of forming separation grooves by means of laser beam. After forming the separation grooves by means of laser beam, the substrate can be separated into individual chips. Laser scribing is capable of forming a deeper and narrower groove than other methods such as dicing. This enables it to decrease the proportion of the substrate surface area occupied by the grooves so as to increase the number of chips that can be produced from one substrate. In addition, the deeper separation groove decreases the possibility of breaking failure. Thus laser scribing is suited for separating small chips.

In this embodiment, laser scribing is employed for separating the nitride semiconductor light emitting device described in Embodiment 1. This not only increases the number of chips that can be produced from brie substrate and improves the yield of production, but also improves the efficiency of extracting light from peripheral area of the chip that is completed in this way.

Figure 6A:
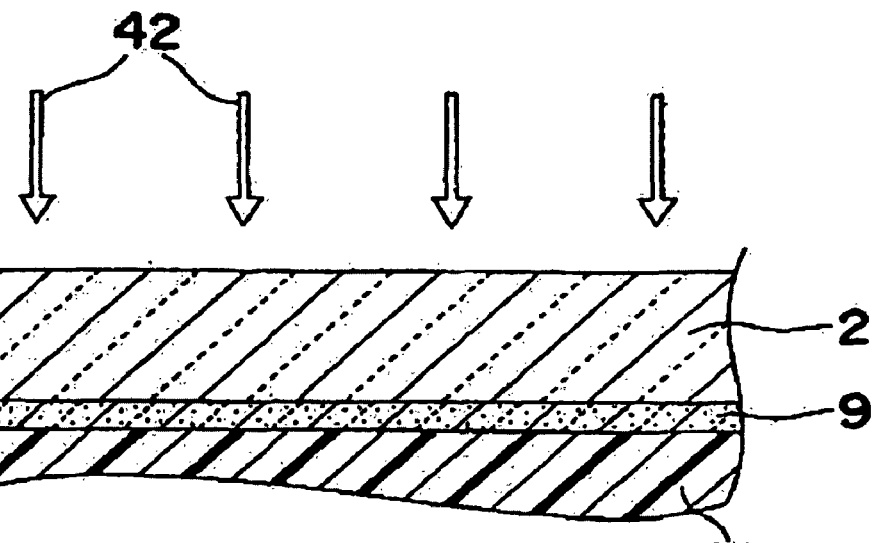
FIG. 6A is a schematic sectional view showing a process of laser scribing.
Figure 6B:
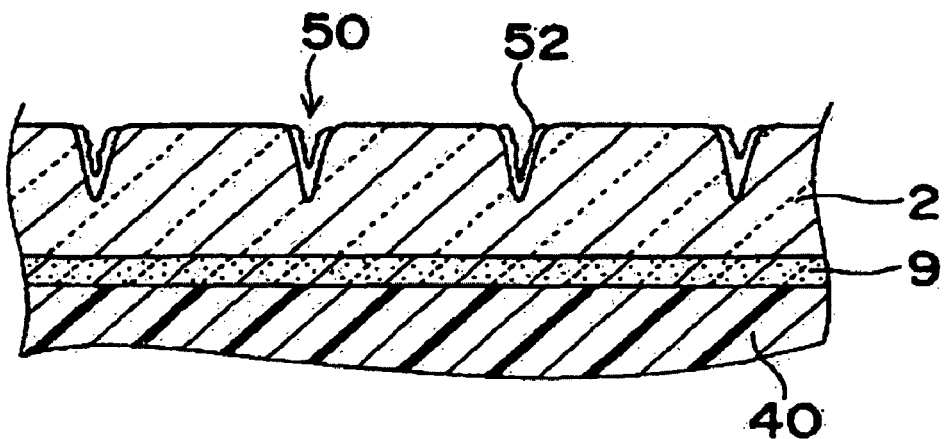
FIG. 6B is a schematic sectional view showing a process subsequent to that of FIG. 6A.
Figure 6C:
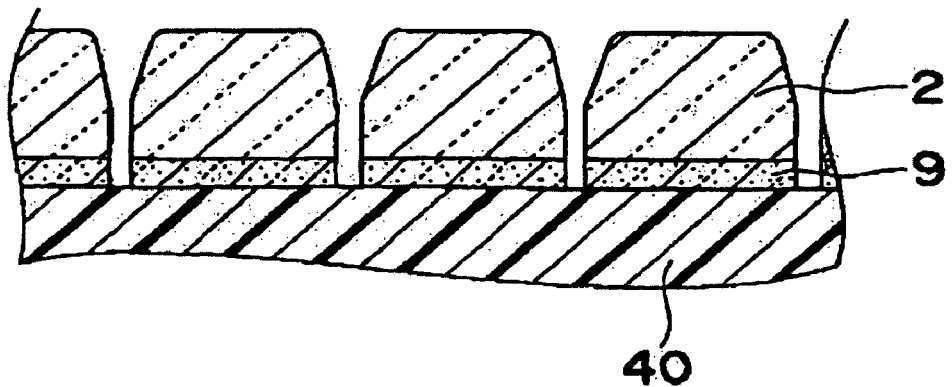
FIG. 6C is a schematic sectional view showing a process subsequent to that of FIG. 6B.

First, the method of separating the substrate by laser scribing will be described. FIG. 6A through FIG. 6C are sectional views showing/schematically the process of separating the substrate by laser scribing. In FIG. 6A through FIG. 6C, electrodes and protective film are omitted for simplicity.

First, as shown in FIG. 6A, the substrate 2 where the elements have been formed is fastened onto an adhesive sheet 40 with the side of the semiconductor layer 9 facing down. After making the substrate 2 thinner by grinding on the back surface thereof (for example, from the original thickness of 450 μm to 85 μm), the substrate 2 is irradiated with a laser beam 42 along the separation lines on the back surface. The laser beam 42 may be generated by a YAG laser oscillating at a wavelength of 355 nm. Diameter of the laser beam 42 is, for example, set to 3 to 8 μm.

Figure 7:
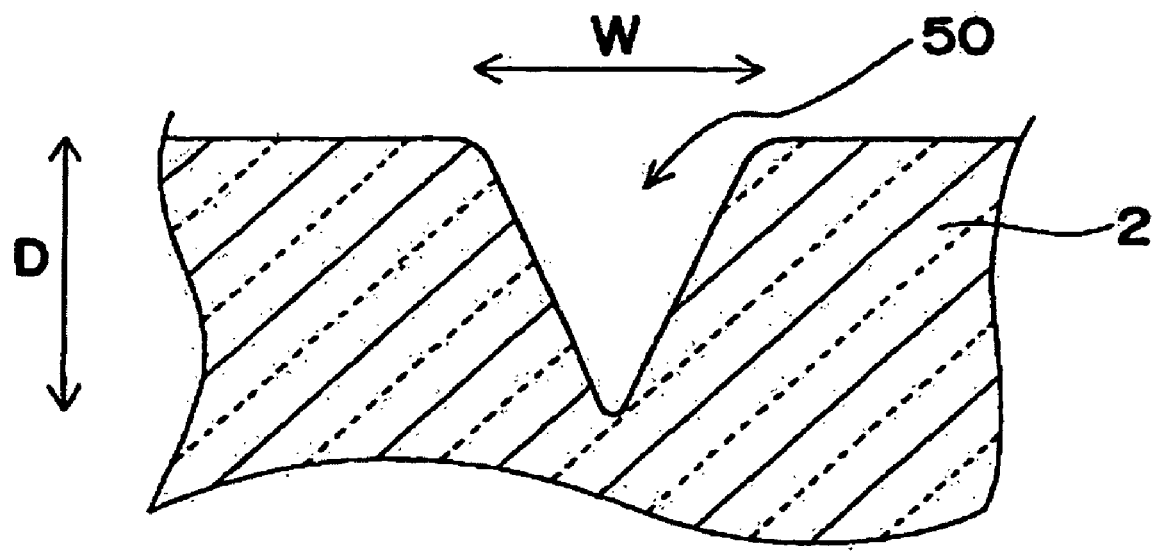
FIG. 7 is a schematic sectional view showing a groove formed by laser scribing.

Irradiation with the laser beam 42 forms a groove 50 having substantially V-shaped cross section in the substrate 2 as shown in FIG. 6B. There is deposition 52 that is the substrate material which was melted by the laser beam 42 and solidified again in the groove 50. Enlarged view of the groove 50 is shown in FIG. 7. Ratio, of width W to depth D of the V groove 50, W/D, is preferably 0.5 or less, more preferably 0.3 or less as shown in FIG. 7. Depth D of the V groove is preferably in a range from 40 to 60% of the thickness of the substrate 2. For example, width W of typical V groove 50 is from about 8 to 15 μm and depth D is from 40 to 60 μm. Such a V groove 50 has sufficient depth to act as the separation groove of the substrate 2 of which thickness as been reduced to, for example, 85 μm.

The substrate 2 is separated into chips by roller breaking or other appropriate method as shown in FIG. 6C. Since the V groove 50 formed by laser scribing has a sufficient depth, defects such as chipping can be suppressed from occurring during breaking. Also because the V groove 50 formed by laser scribing is narrow, a larger number of chips can be produced from one substrate. Most of the deposit 52 comes off the substrate when is broken into chips.

Figure 8A:
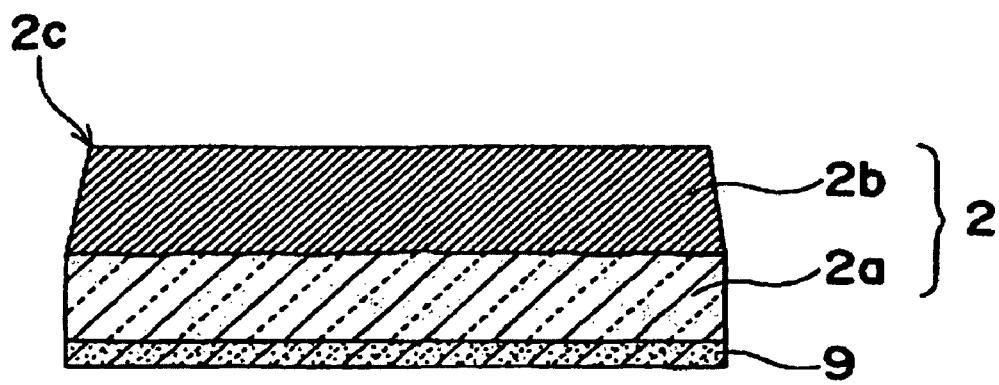
FIG. 8A schematically shows a cross section of a chip after laser scribing.

The nitride semiconductor light emitting device obtained by separating as described above has a characteristic configuration. FIG. 8A is a schematic sectional view showing the side face of the nitride semiconductor that is obtained by laser scribing and breaking. As schematically shown in FIG. 8A, side face of the nitride semiconductor light emitting device separated as described above is divided into a region 2a on the semiconductor layer side formed by breaking and aback side region 2b formed by laser scribing. While the region 2a oh the semiconductor layer side formed by breaking is substantially at right angles to the principal surface of the substrate, the back side region 2b formed by laser scribing is inclined toward the inside of the substrate. As a result, cross section of the nitride semiconductor light emitting device has substantially trapezoidal shape in the back side half of the substrate as shown in FIG. 8A.

In the back side region 2b of the side face of the substrate, the surface is denatured, due to melting by the laser beam so that the surface roughness has increased and the region near the surface is discolored. Since the nitride semiconductor light emitting device of rectangular shape has the denatured back side region 2b on all of the four sides thereof, using the device as it is results in a low efficiency of extracting light. That is, part of the light emitted through the side face of the substrate 2 is absorbed by the denatured back side region 2b. Also because the substrate 2 forms an optical waveguide, part of die light that undergoes multiple reflections in the substrate 2 is absorbed by the denatured back side region 2b, too.

Figure 8B:
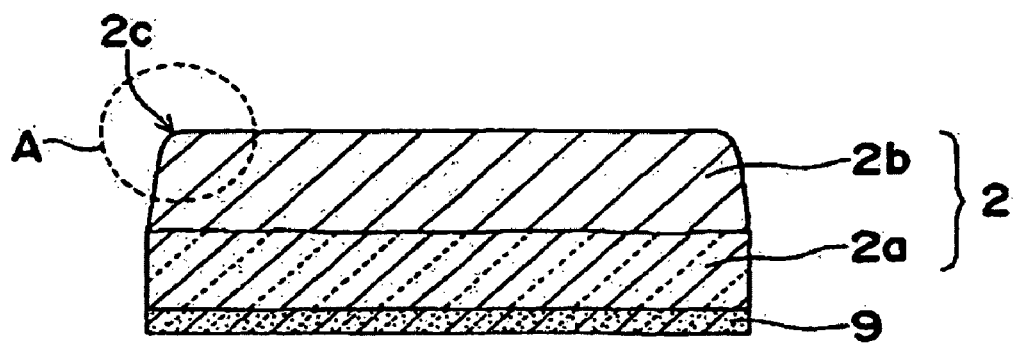
FIG. 8B schematically shows a cross section of a chip after sand blast.
Figure 8C:
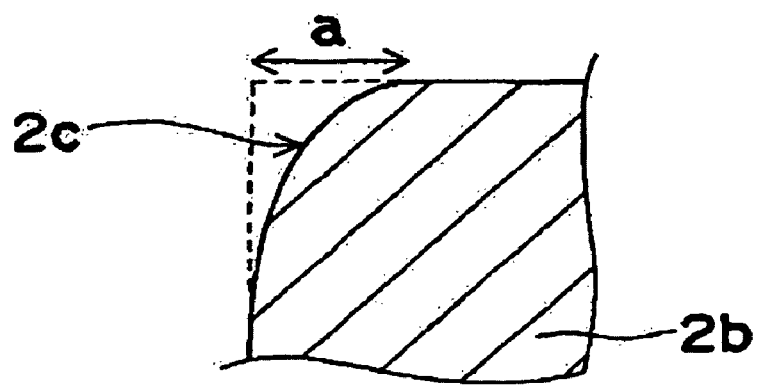
FIG. 8C is a partially enlarged sectional view of portion "A" in FIG. 8B.

In this embodiment therefore, back surface of the substrate 2 is sand blasted to remove the denatured material from the back side region 2b. Sand blasting can be carried out by using abrasive particles made of alumina. In the substrate 2 that has been sandblasted, the back side region 2b has a rounded shape as shown in FIG. 8B. The sand blast process also decreases the surface roughness of the back side region 2b to some extent. On the shoulder 2c of the back surface of the substrate, the corner is rounded as shown in FIG. 8C. A larger radius of curvature on the shoulder 2c means that more of the denatured layer has been removed from the back side region 2b. The surface roughness on the back side region 2b of the substrate side face also reflects the degree of removing the denatured layer.

The sand blasting process may be carried out either before or after breaking the substrate 2 into chips as shown in FIG. 6C. In case sand blast is carried but before breaking, the deposit 52 remaining in the separation groove 50 of the substrate 2 can be removed before breaking. This makes it possible to prevent such trouble as the deposit 52 is scattered during breaking and sticks onto the device again. In case sand blast is carried out after the breaking process shown in FIG. 6C, on the other hand, the space between the chips can be enlarged during sand blasting by expanding the adhesive layer 40. This enables it to remove the denatured material from the back side region 2b more efficiently. The sand blast process may also be carried out using larger abrasive particles, which enable if to remove the denatured layer more efficiently in a shorter period of time. For that purpose, the abrasive particle size is preferably 10 µm or larger, and more preferably 40 µm or larger. Sand blasting after breaking the substrate into chips makes such troubles as chipping of the substrate less likely to occur and improves the yield of production in comparison to the case in which sand blast is carried out before breaking. Sandblasting is required only to remove the denatured layer that absorbs light, and it is not necessary to make the surface roughness on the back side region 2b of the substrate side face equal to that of the other surfaces (such as back surface of the substrate). After the sand blast process, surface roughness on the back side region 2b of the substrate side face remains larger than that of the back surface of the substrate (for example, 1.5 times or more).

Figure 9:
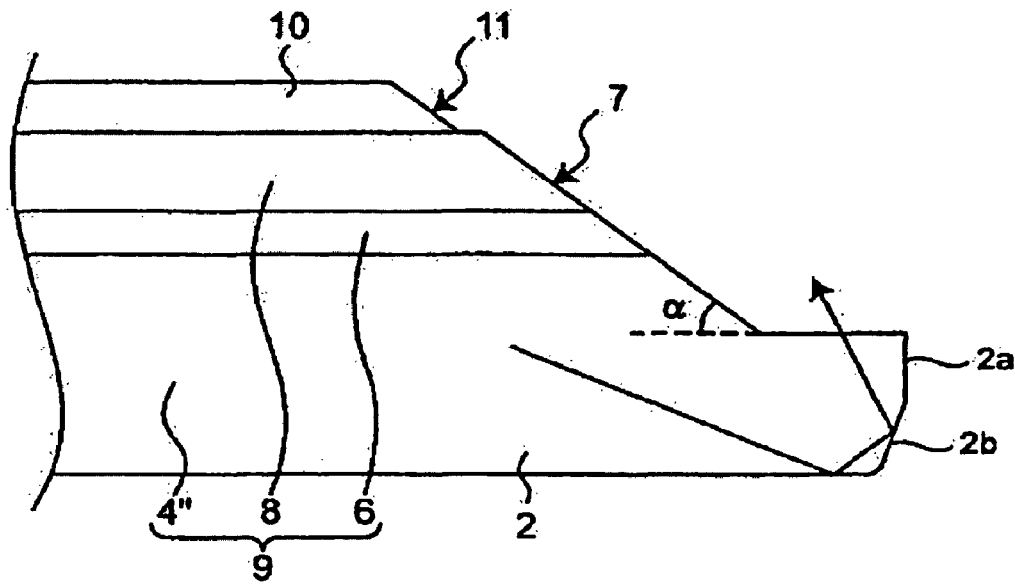
FIG. 9 schematically shows an optical path in the vicinity of the end face of the device after laser scribing.

The nitride semiconductor light emitting device obtained as described above has higher efficiency of extracting light from the periphery of the device and, together with the effect of controlling the taper angle, of the end face of the p-side nitride semiconductor layer 8 and/or the light transmitting electrode 10, provides improved intensity of light emission on the periphery of the device, where light intensity tends to be weaker. This effect will be briefly explained with reference to FIG. 9. FIG. 9 is a sectional view schematically showing periphery of the device mat has been separated by laser scribing. As described previously, as the V-shaped separation groove is formed by laser scribing, the back side region 2b of the substrate side face is inclined. Since light that has been propagating at such an angle that causes total reflection is reflected on the inclined back side region 2b at a different angle as shown in FIG. 9, it is made easier to extract the light to the outside of the substrate. Moreover, much of the light is directed upward. Therefore, efficiency of extracting light is improved and the intensity of light emission on the periphery of the device can be increased compared to a case where the side face of the substrate 2 is perpendicular to the substrate surface.

As shown in FIG. 9, in a cross section that is perpendicular to the principal surface of the substrate (cross sectional parallel to the shorter side of the device in FIG. 9), the inclined surface formed in the p-side layer 9 (namely the end face 7 of the p-side layer) and the inclined surface formed on the side face of the substrate 2 (namely the back side region 2b) are inclined so as to approach each other toward the periphery of the device. In other words, the inclined surface formed in the p-side layer 9 is so inclined that the cross sectional area of the substrate parallel to the principal surface of the substrate becomes gradually smaller in the direction of stacking the semiconductor layers (namely the direction from the n-side nitride semiconductor layer 4 toward the p-side nitride semiconductor layer 9). The inclined surface formed on the side face of the substrate 2, on the other hand, is so inclined that the cross sectional area of the substrate parallel to the principal surface of the substrate gradually becomes smaller toward the back surface of the substrate. This configuration increases the efficiency of extracting light from the periphery of the device where the light intensity tends to be low. As a result, efficiency of light emission of a small light emitting device can be improved so as to provide the light emitting device that is small in size and high in luminance.

Embodiment 3

Figure 10:
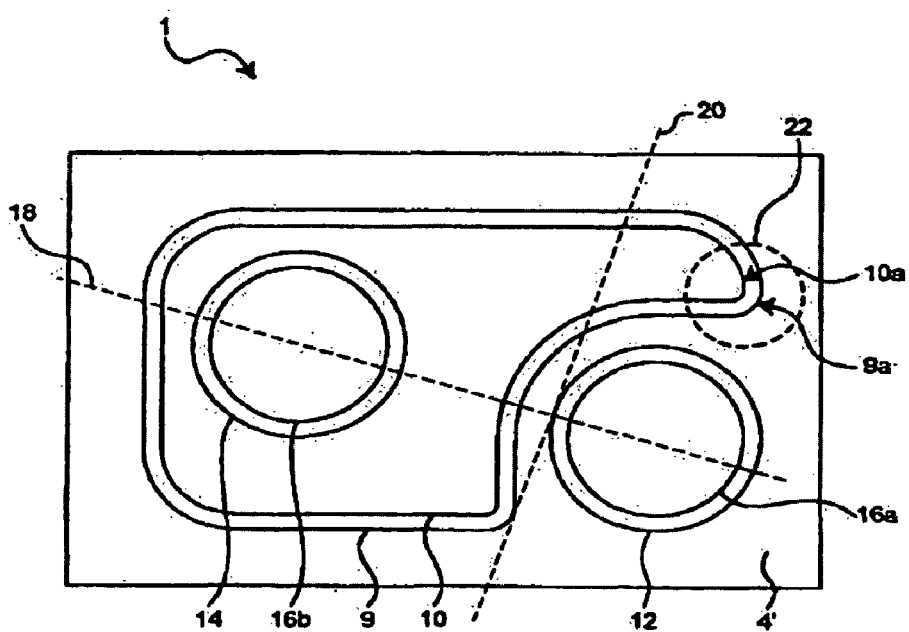
FIG. 10 is a top view of a nitride semiconductor light emitting device according to a third embodiment of the present invention.

FIG. 10 is a top view showing a nitride semiconductor light emitting device according to Embodiment 2 of the present invention. This embodiment is similar to Embodiment 1 except for those described below.

In this embodiment, the n-side pad electrode 12 is formed at a position near a corner of the chip, while the p-side layer 9 extends along one side face of the n-side pad electrode 12. Assuming the centerline 18 that connects the center of the p-side pad electrode 14 and the center of the n-side pad electrode 12 and the tangent line 20 of the n-side pad electrode 12 that crosses the centerline 18 at right angles, then the extension of the p-side layer 9 is located on the side of the tangent line 20 opposite to the n-side pad electrode 14. As a result, intensity of light emission in the extension of the p-side layer 9 tends to become lower, and the decrease in intensity of light emission is more conspicuous in the distal end portion 22. In this embodiment, therefore, the end portion 9a of tapering off shape is provided in the distal end region 22 of the extension of the p-type layer 9. The light transmitting electrode 10 is also provided with a tapering-off shaped end portion 10a at a similar position. In this embodiment, too, since the taper angle of the end face is made smaller in the tapering-off shaped end portion provided on the p-side layer 9 and the light transmitting electrode 10, uniform light emission over the entire surface can be achieved as well as increasing the efficiency of extracting light at the distal end portion where the intensity of light emission tends to be lower and improving the light emission of the entire device.

Embodiment 4

Figure 11:
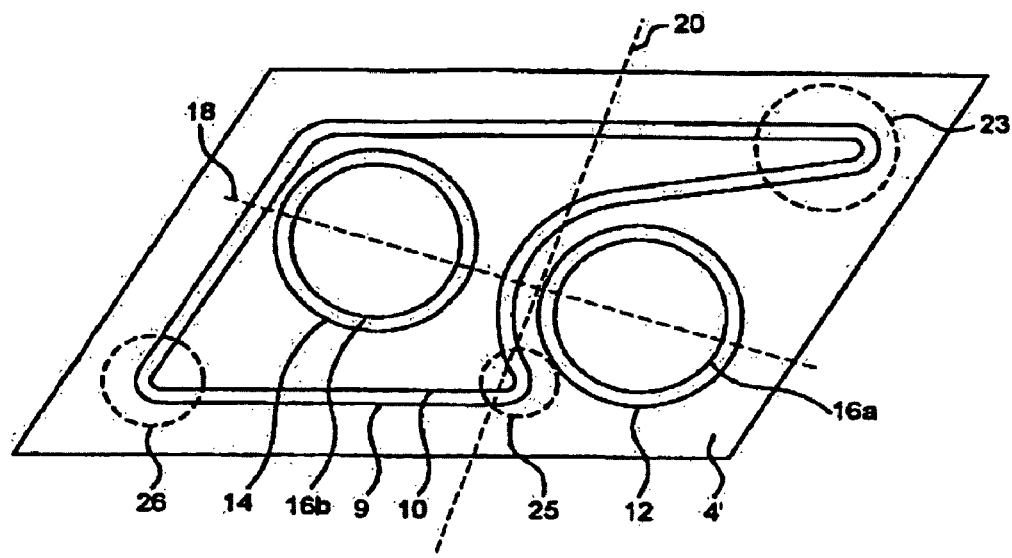
FIG. 11 is a top view of a nitride semiconductor light emitting device according to a fourth embodiment of the present invention.

FIG. 11 is a top view showing a nitride semiconductor light emitting device according to Embodiment 3 of the present invention. This embodiment is similar to Embodiment 1 except for those described below.

The nitride semiconductor light emitting device of this embodiment has chip shape of parallelogram as shown in FIG. 11. A chip having a shape of parallelogram has obtuse angles at corners on one diagonal and acute angles at corners on another diagonal. In this case, as shown in FIG. 11, the p-side pad electrode 14 and the n-side pad electrode 12 are preferably arranged near to the corners of obtuse angles of the chip having the shape of parallelogram. With such a configuration, efficiency of extracting light at corners where the intensity of light emission tends to be lower can be improved. While current density tends to be low resulting in a lower intensity of light emission in a region located away from the current path that lies on a line connecting the p-side pad electrode 14 and the n-side pad electrode 12, corners 23 and 26 in such a region have acute angle. Therefore, a tapering-off-shaped end portion is formed in the p-side layer 9 by etching the p-side layer 9 along the chip. Since the light transmitting electrode 10 has similar shape to the p-side layer 9, a tapering-off-shaped end portion is formed also in the light transmitting electrode 10. As a result, taper angle of the end face can be decreased so as to improve the efficiency of extracting light, in the corners 23 and 26 of the chip where the intensity of light emission tends to be lower.

In this embodiment, the p-side layer 9 extends along both side faces of the n-side pad electrode 12. Similarly to Embodiment 1, with the centerline 18 connecting the center of the p-side pad electrode 14 and the center of the n-side pad electrode 12 and the tangent line 20 of the n-side pad electrode 12 crossing the centerline at right angles, the extended portions on both sides are located on the side of the tangent line 20 opposite to the p-side pad electrode 14. Accordingly, in this embodiment, a tapering-off-shaped end portion is formed, not only in the region 23 that is located near the corner of the chip but also in the p-side layer 9 that extends in the opposite region 25. In this embodiment, too, uniform light emission over the entire surface can be achieved as well as increasing the efficiency of extracting light by decreasing the taper angle of the end face in a region where the intensity of light emission tends to be lower and improving the light emission of the entire device.

Embodiment 5

Figure 12:
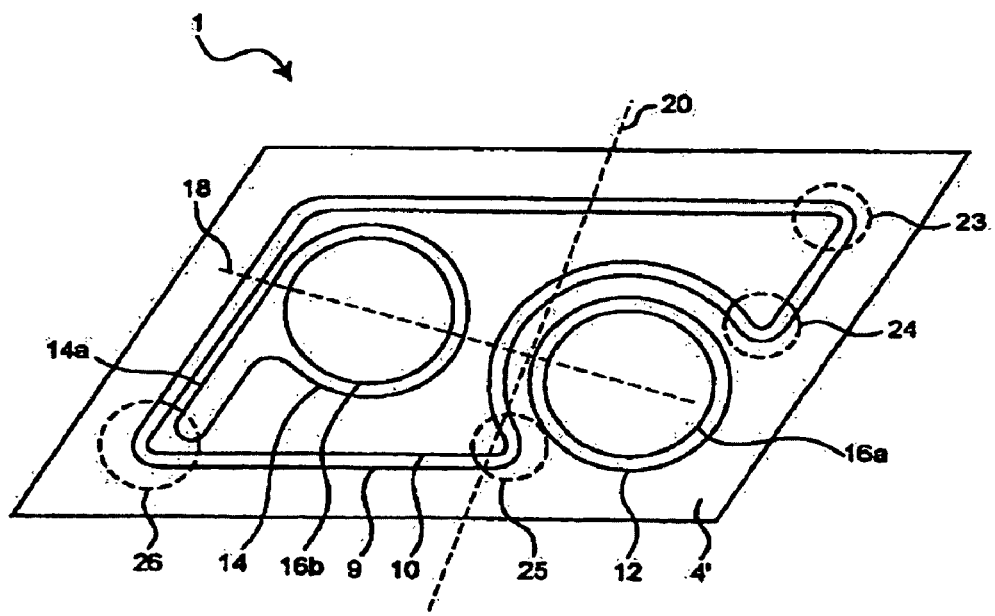
FIG. 12 is a top view of a nitride semiconductor light emitting device according to a fifth embodiment of the present invention.

FIG. 12 is a top view showing a nitride semiconductor light emitting device according to Embodiment 4 of the present invention. This embodiment is similar to Embodiment 3 except for those described below.

In this embodiment, first, the p-side layer 9 is extended from the region 23 located near the corner of the chip toward the n-side pad electrode 12, and a tapering-off-shaped end portion is formed in the end region 24. Thus more uniform light emission over the entire surface can be achieved by increasing the surface area where the light transmitting electrode 10 is formed as well as increasing the efficiency of extracting light by in the distal end portion where the intensity of light emission tends to be lower.

Second, the intensity of light emission in the corner 26 of the chip is increased by extending the a part of the p-side pad electrode 14 toward the corner 26 (extended conductor portion) and making use of the effect thereof together with the effect of controlling the taper angle of the end face described previously, in this embodiment. In this embodiment, too, uniform light emission over the entire surface can be achieved while increasing the efficiency of light emission of the entire device.

Embodiment 6

In this embodiment, unlike Embodiments 1 through 4, taper angles of the end faces of the p-side laser 9 and the light transmitting 10 electrode 10 are controlled to be smaller in a region where the light intensity tends to be relatively lower, while the p-side laser 9 and the light transmitting electrode 10 are formed in the conventional planar shape. FIGS. 13A through 13F are top views showing, variations of the configuration of the nitride semiconductor light emitting device according to this embodiment. In the region where the light intensify tends to be relatively lower, the intensity of light emission tends to become lower at a position located away from the current path that lies on the line connecting the p-side pad electrode and the n-side pad electrode, while it depends on arrangement of the n-side pad electrode and the p-side pad electrode and the resistance of the light transmitting electrode. That is, the intensity of light emission tends to become lower as the distance from the p-side pad electrode is larger, and the intensity of light emission tends to become particularly lower at a position located away from the n-side pad electrode.

In the example shown in FIG. 13, the n-side pad electrode 12 and the p-side pad electrode 14 are located at two corners on diagonal of the rectangular chip. In this example, light intensity in the corner regions 28 and 29 becomes relatively low where the n-side pad electrode 12 and the p-side pad electrode 14 are not formed. Therefore, taper angle of the end faces of the light transmitting electrode 10 and/or the p-side laser 9 are made relatively smaller in these regions. In the example shown in FIG. 13B, the p-side pad electrode 14 is moved along one side of the chip to substantially mid point of the side from the position in the example shown in FIG. 13A. As a result, light emission intensity becomes higher in the corner region 28 that is nearer to the p-side pad electrode 14 than in the corner region 29 located at opposite position on the diagonal. Therefore taper angle of the end face of the light transmitting electrode 10 and/or the p-side laser 9 is made smaller in the corner region 29 than in the corner region 28. With other respects, this example is similar to that shown in FIG. 13A. In the example shown in FIG. 13C, the n-side pad electrode 12 and the p-side pad electrode 14 are located at two corners along one side of the rectangular chip. In this case, light emission intensity tends to become lower in the regions 30 and 31 located near both corners on the side opposite to the side where the pad electrode is located. Therefore taper angle of the end face of the light transmitting electrode 10 and/or the p-side laser 9 is made smaller in these regions.

Figure 13A:
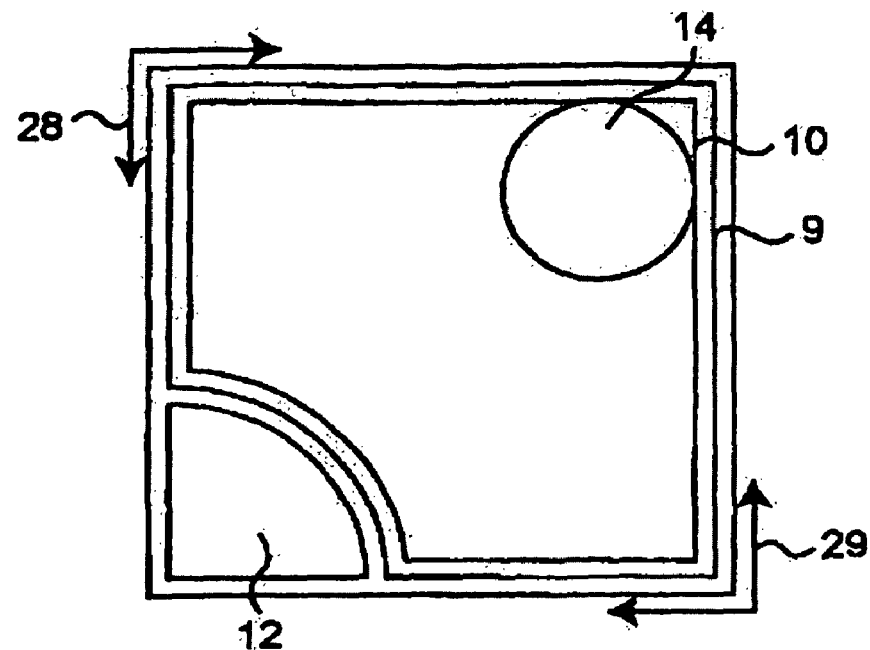
FIG. 13A is a top view of a nitride semiconductor light emitting device according to a sixth embodiment of the present invention.
Figure 13B:
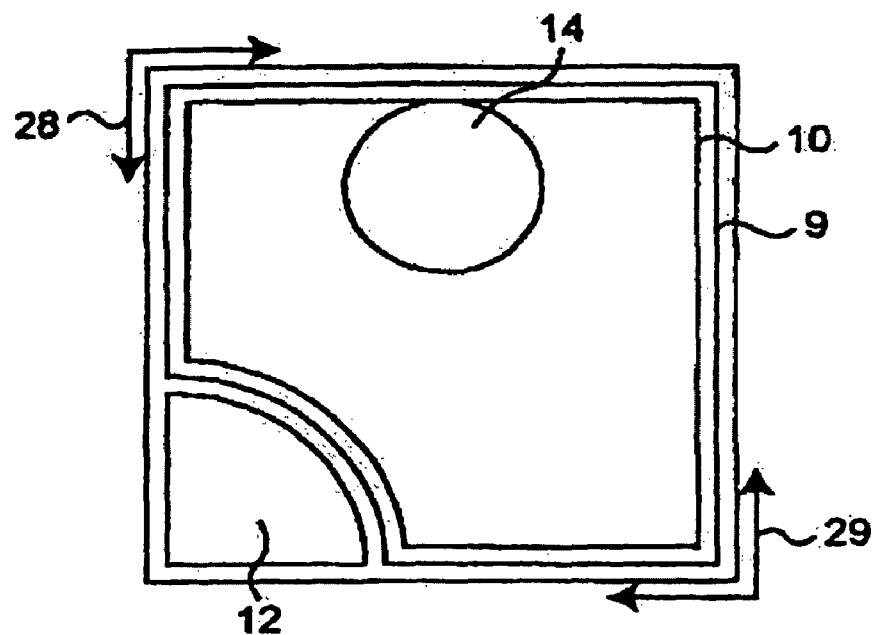
FIG. 13B is a top view of another example of the nitride semiconductor light emitting device according to the sixth embodiment of the present invention.
Figure 13C:
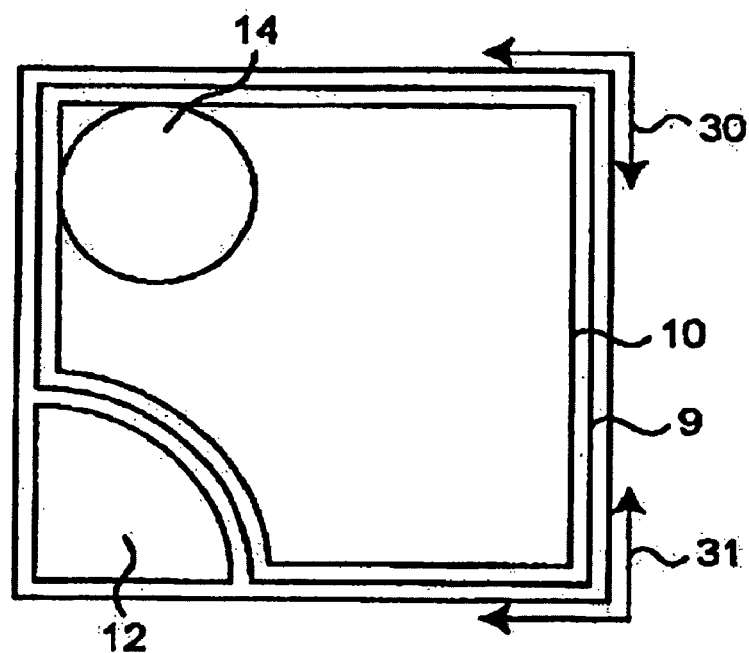
FIG. 13C is a top view of another example of the nitride semiconductor light emitting device according to the sixth embodiment of the present invention.
Figure 13D:
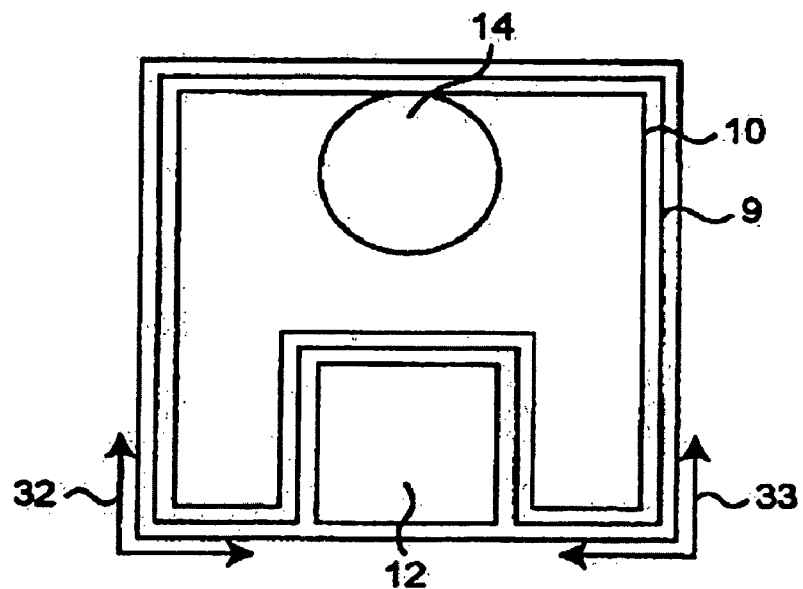
FIG. 13D is a top view of another example of the nitride semiconductor light emitting device according to the sixth embodiment of the present invention.
Figure 13E:
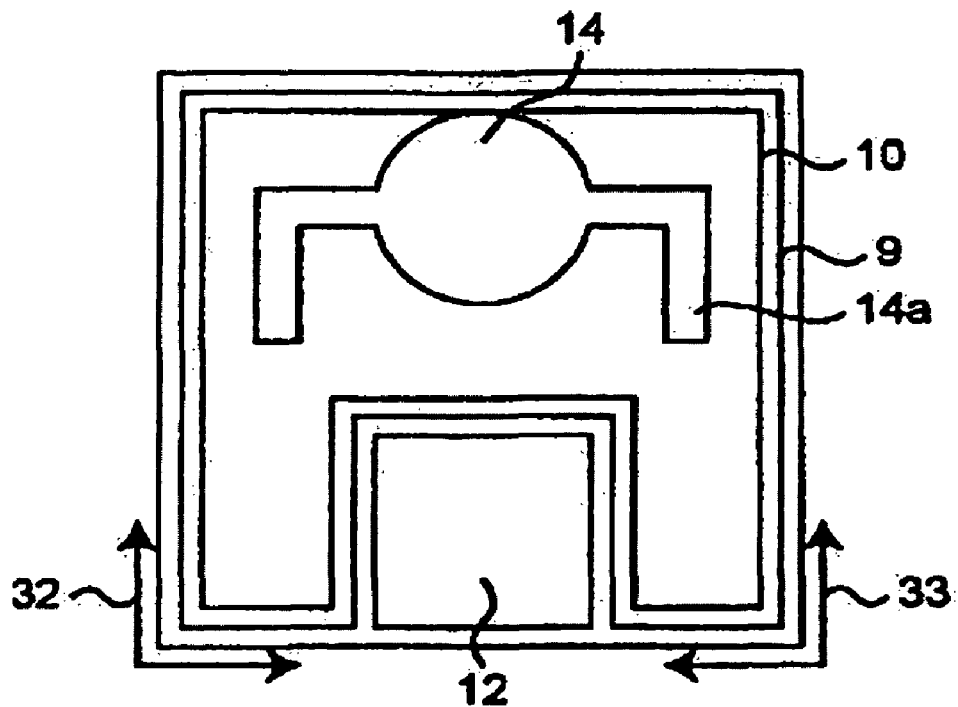
FIG. 13E is a top view of another example of the nitride semiconductor light emitting device according to the sixth embodiment of the present invention.
Figure 13F:
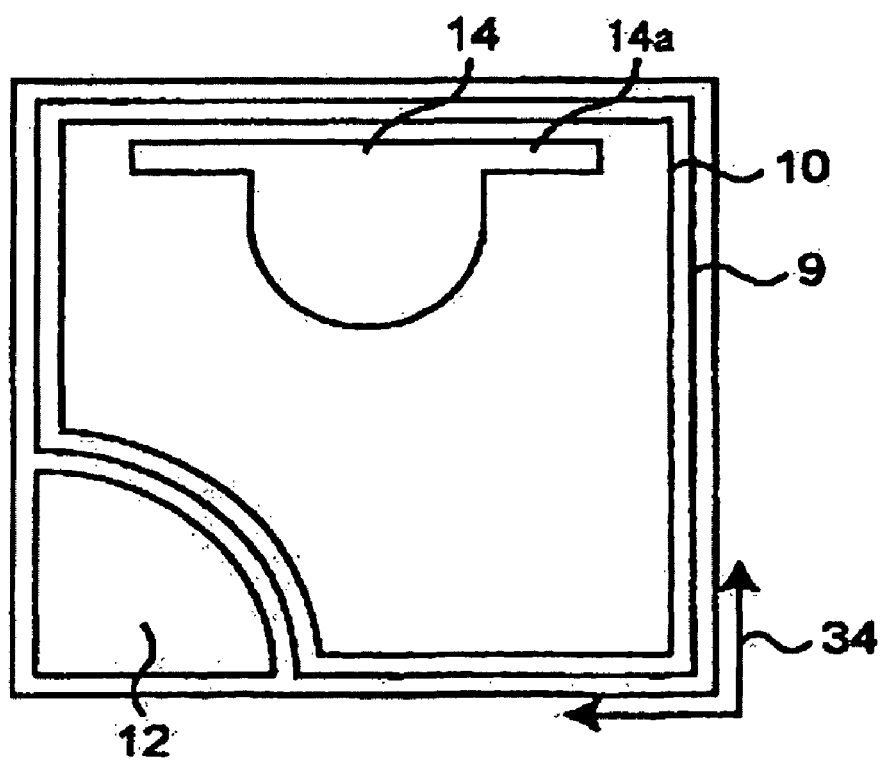
FIG. 13F is a top view of another example of the nitride semiconductor light emitting device according to the sixth embodiment of the present invention.

In the example shown in FIG. 13D, the n-side pad electrode 12 and the p-side pad electrode 14 are formed at substantially the centers of two opposing sides. In this example, light emission intensity tends to become lower in the corner regions 32 and 33 located on both sides of the n-side pad electrode 12. Therefore taper angle of the end face of the light transmitting electrode 10 and/or the p-side laser 9 is made smaller in these regions. The example shown in FIG. 13E is similar to the example shown in FIG. 13D, except for the shape of the p-side pad electrode 14. Extension conductors 14a are provided to extend from both sides of the p-side pad electrode 14 toward the regions 32 and 33. The extension conductors 14a can increase the current density in the corner regions 32 and 33. Decrease in the intensity of light emission in the regions 32 and 33 can be suppressed further by the synergy effect of increasing the current density by the extension conductors 14a and increasing the effect of extracting light by controlling the taper angle. The example shown in FIG. 13F is also similar to the example shown in FIG. 13E, except for the shape of the p-side pad electrode 14, and an extension conductor is provided to extend from the p-side pad electrode 14 toward the corner regions 28. In this example, however, taper angle is not controlled in the corner region 28 in consideration of the effect of the extension conductor.

Embodiment 7

Figure 14A:
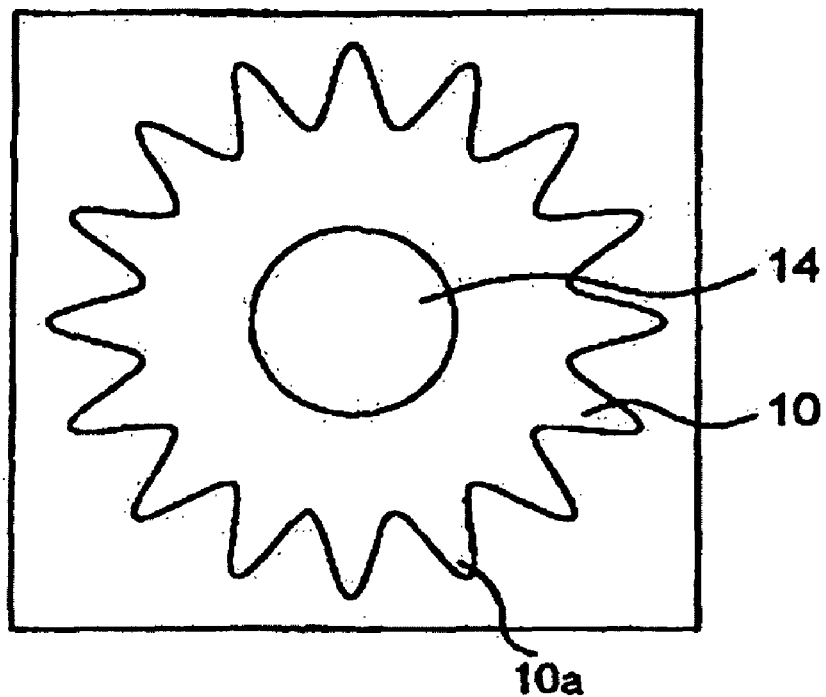
FIG. 14A is a top view of a nitride semiconductor light emitting device according to a seventh embodiment of the present invention.
Figure 14B:
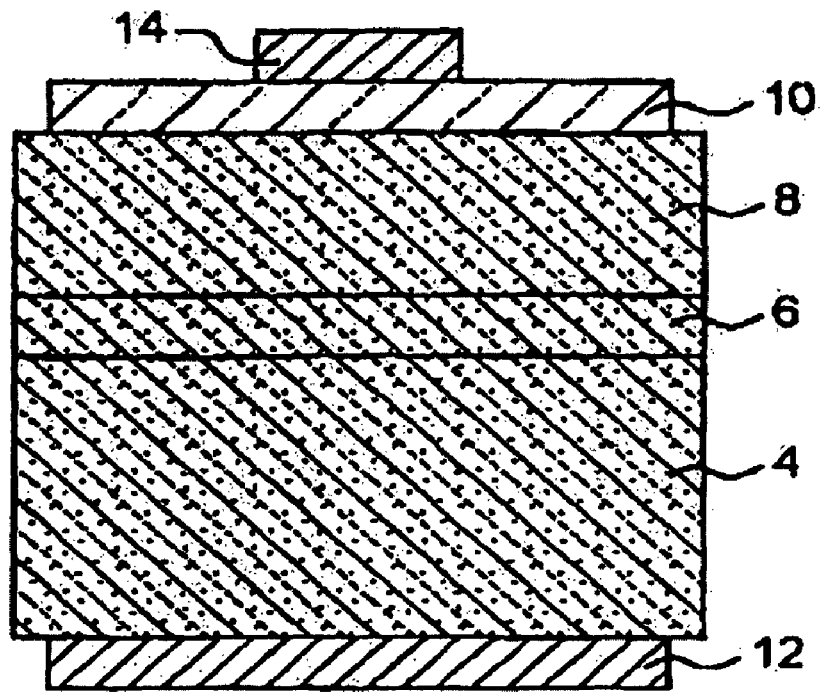
FIG. 14B is a sectional view of the nitride semiconductor light emitting device according to the seventh embodiment of the present invention.

FIGS. 14A and 14B are top view and sectional view, respectively, of the nitride semiconductor light emitting device according to this embodiment. The nitride semiconductor light emitting device of this embodiment does not have a different-kind substrate made of a material other than nitride semiconductor, and comprises the n-side nitride semiconductor layer 4, the active layer 6 and the p-side nitride semiconductor layer 8, where the light transmitting electrode 10 is formed on the top surface of the p-side nitride semiconductor layer, the p-side pad electrode 14 is formed thereon, and the n-side pad electrode 12 is formed on the bottom of the n-side nitride semiconductor layer. The nitride semiconductor light emitting device of such a constitution can be manufactured by, for example, using a GaN substrate as part of the n-side nitride semiconductor layer.

In this constitution, too, the top surface of the p-side nitride semiconductor layer 8 makes the light emerging surface. However, since the n-side pad electrode 12 is formed on the back of the n-side nitride semiconductor layer, intensity of light emission is determined only by the distance from the p-side pad electrode 14. That is, current density decreases with the distance from the p-side pad electrode, thus resulting in lower intensity of light emission. In this embodiment, therefore, a plurality of protrusions 10a are formed in radial configuration on the light transmitting electrode 10, with each protrusion 10a being shaped to taper off. This constitution makes it possible to decrease the taper angle of the end face in a region of relatively weak light emission, namely a region located away from p-side pad electrode 14, thereby to increase the efficiency of extracting light in that region. As a result, the nitride semiconductor light emitting device having high intensity of light emission uniformly over the entire chip can be manufactured.

Embodiment 8

Figure 15A:
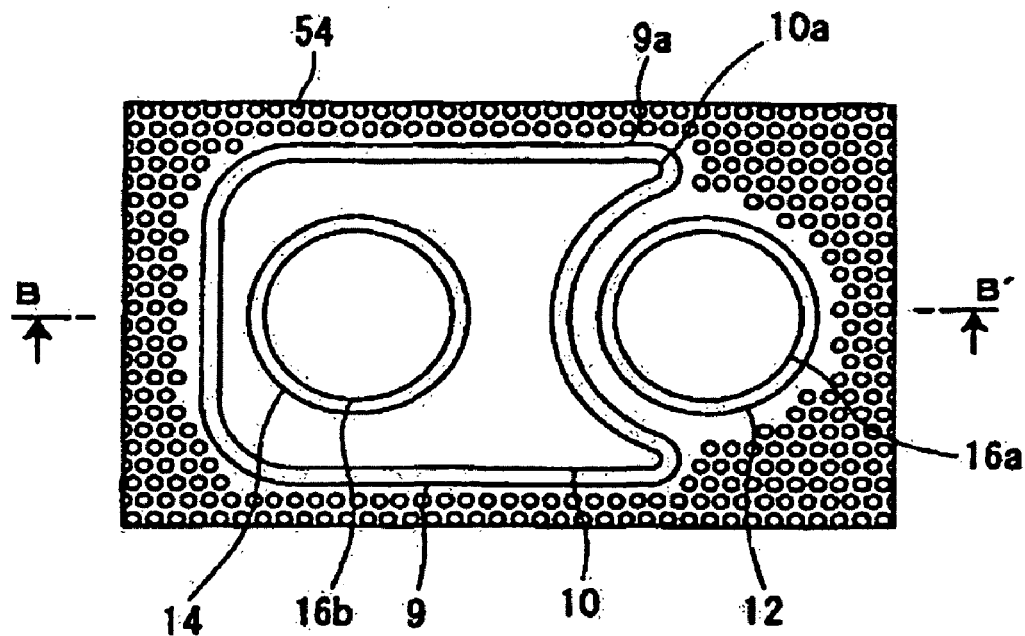
FIG. 15A is a top view of a nitride semiconductor light emitting device according to an eighth embodiment of the present invention.
Figure 15B:
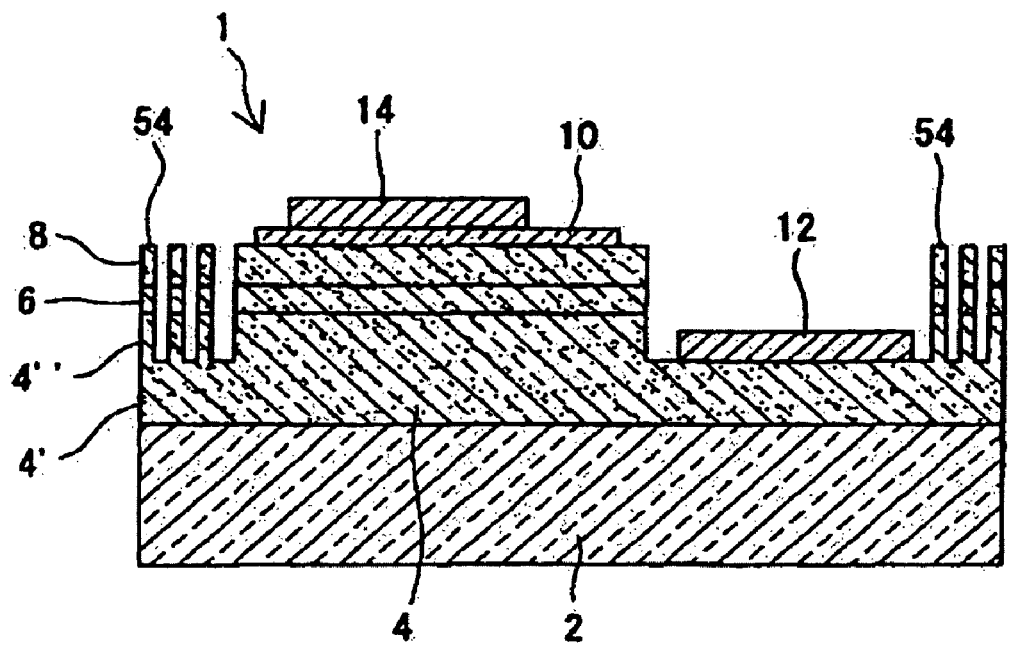
FIG. 15B is a sectional view of the nitride semiconductor light emitting device according to the eighth embodiment of the present invention.

FIGS. 15A and 15B are top view and sectional view, respectively, of the nitride semiconductor light emitting device according to Embodiments. In FIG. 15B, the protective insulation film 16 is omitted for simplicity. In this embodiment, the efficiency of extracting light in the periphery of the device is increased further by forming protrusions 54 of semiconductor layer, in the region between the p-side layer 9 and the periphery of the device. With other respects, this embodiment is similar to Embodiment 1. In the description that follows, a portion of the p-side layer 9 that has the light transmitting electrode 10 will be referred to as a first region, and a region surrounded by the first region and the circumference of the device will be referred to as a second region, as the nitride semiconductor light emitting device is viewed from the side of forming the electrodes. As shown in FIG. 15A, the first region is surrounded by the second region. The second region is surrounded by the circumference of the device.

As shown in FIG. 15A and FIG. 15B, a plurality of protrusions 54 are formed in the second region where the n-side nitride semiconductor layer 4' is exposed. The plurality of protrusions 54 have the effect of increasing the efficiency of extracting light as described later. The second region where the n-side nitride semiconductor layer 4' is exposed provides a surface whereon the n-side pad electrode 12 is formed (surface of n-side contact layer) and, at the same time, provides a space for division when separating the substrate into chips. Forming the protrusions 54 in the second region has various advantages. First, forming the protrusions 54 at the same time as the n-side nitride semiconductor layer 4' is exposed in the second region makes it possible to form the protrusions 54 without additional process. It also enables it to reduce the device size compared to a case where a region is prepared specifically, to form the protrusions 54. Moreover, while the intensity of light emission is lower in the second region near the circumference of the device since light is not emitted therein, efficiency of extracting light from the second region can be improved by forming the protrusions 54, thereby improving the uniformity of light emission over the light emerging surface as a whole.

Efficiency of extracting light through the light emerging surface can be improved by 10 to 20% by forming the protrusions 54 in the second region. The reasons for this effect are supposedly as follows, although not yet proved:

1. Light propagating through the n-side layer 4 (especially in then side contact layer) is taken from the n-side layer 4 into the protrusions 54, and is extracted from the top or mid portion of the protrusion 54 to the light emerging surface.

2. Light radiated from the end face of the active layer 6 sideways undergoes diffuse reflection on a plurality of protrusions 54 and is extracted to the light emerging surface.

3. Light propagating through the n-side layer 4 (especially in the n-side contact layer) undergoes diffuse reflection on the side face of the protrusions 54 near the base of the protrusions 54 (junction between the n-side layer 4 and the protrusions 54) and is extracted to the light emerging surface.

Proportion of the area occupied by the second region becomes greater as the device size decreases. This means that the device property deteriorates and the efficiency of light emission decreases, if the separation groove reaches the first region (namely the p-side layer 9) where current flows to emit light when forming the separation grooves on the substrate for dividing the substrate into chips. Therefore, it is necessary to form the first region while keeping such a distance from the circumference of the device as the separation grooves formed on the back of the substrate do not reach the first region. Accordingly, proportion of the area occupied by the second region becomes greater as the device size decreases. Therefore, it is effective to form the protrusions 54 in the second region in the case of a small-sized device.

The nitride semiconductor light emitting device shown in FIGS. 15A and 15B has DH (double heterojunction) structure, where part of the active layer 6 makes the light emitting portion. Thus as shown in FIG. 15B, the protrusions 54 provided in the second region are preferably higher than the active layer 6 in the cross section of the device. The bottom between the protrusions 54 is preferably lower than the active layer 6. More specifically, while it suffices that the protrusions 54 are higher than at least the interface between the active layer 6 and the n-side nitride semiconductor layer 4", but are preferably higher than the interface between the active layer 6 and the p-side nitride semiconductor layer 8. While it suffices that the bottom between the protrusions 54 is lower than at least the interface between the active layer 6 and the p-side nitride semiconductor layer 8, but is preferably lower than the interface between the active layer 6 and the n-side nitride semiconductor layer 4". This constitution effectively increases the efficiency of extracting light from the active layer 6.

It is also preferable that the protrusions 54 are substantially the same in height as the p-side layer 9. This makes it possible to effectively extract light from the top of the protrusions 54 through the light emerging surface, without being blocked by the semiconductor layer 9 in the first region where the light transmitting electrode 10 is formed. Light can be extracted even more efficiently by making the protrusions 54 higher than the p-side nitride semiconductor layer 8, preferably higher than the light transmitting electrode 10.

The effect described above is made greater when width of the cross section of the protrusion 54 is gradually decreased in the direction of stacking, the semiconductor layers, namely from the n-side layer 4' toward the p-side layer 9. That is, light emitted from the active layer 6 can be reflected more efficiently on the side face of the protrusion 54, by forming the protrusions 54 with inclined side faces. It is also made possible to diffuse with high efficiency the light propagating through the n-side layer 4, and therefore to extract the light with high efficiency through the light emerging surface. Inclination angle of the side face of the protrusion 54 is preferably in a range from 30 to 80 degrees and more preferably from 40 to 70 degrees. Inclination angle of the side face of the protrusion 54 here refers to the angle between the bottom and the inclined side of the protrusion 54 in the longitudinal sectional view thereof.

Cross section of the protrusion 54 may have various shapes such as triangle half ellipse and trapezoid. Planar shape of the protrusion 54 may also have various shapes including circle and triangle. It is particularly preferable that the protrusion 54 has the cross section that becomes smaller toward the distal end, and has circular planar shape. This configuration makes it easier to control the directivity of light and makes it possible to extract light uniformly over the entire surface. Also in case light is extracted from the p-side contact layer 8, it is preferable that the planar shape of the protrusion is not a point but has a definite area.

When the top surface of the protrusion 54 is a flat surface having a definite area, a recess may be provided at substantially the center of the top surface of the protrusion 54. In this case, light propagating through the n-side layer 4 is made easier to emerge from the light emerging surface due to the recess formed on the top surface of the protrusion 54 when if enters the inside of the protrusion 54.

It is preferable to arrange the protrusions 54 in two or more rows, preferably three or more rows from the first region toward the circumference of the device. When viewed in a direction parallel to the substrate surface from the first region toward the circumference of the device, it is preferable to dispose the protrusions 54 in such an arrangement as the protrusions 54 of different rows partially overlap with each other. This arrangement causes the light that has emerged from the first region to reflect and diffuse with high probability on the protrusions 54, thereby increasing the efficiency of extracting light.

The protrusions 54 of this embodiment are preferably formed at the same time as the n-side nitride semiconductor layer 4" is exposed. For example, after forming the p-side nitride semiconductor layer 8, the part of the p-side layer 9 (the first region) whereon the light transmitting electrode 10 is to be formed later and the part where, the protrusions 54 are to be formed (the second region) are covered with resist film, and etching is carried, out until the n-side nitride semiconductor layer 4" is exposed. This enables it to expose the surface for forming the n-side pad electrode 12 and form the protrusions 54 at the same time. Instead of the resist film, ah insulation firm such as SiO₂ may be used for the mask.

The protrusions 54 formed as described above have the same stacking structure as that of the stacked semiconductor layers in the first region. However, while the active layer 6 included in the first region functions as the light emitting layer, the active layer 6 included in the protrusion of the second region does not function as the light emitting layer. This is because the p-side pad electrode 14 is not formed in the second region (protrusion) in contrast to the first region that includes the p-side pad electrode 14. As a result, while the carriers (positive hole and electron) are supplied to the active layer 6 of the first region when power is supplied, the carriers are not supplied to the active layer of the protrusion formed in the second region. The protrusions 54 of this embodiment per se cannot generate light. Therefore, efficiency of light emission is hardly affected even when part of the protrusions 54 is broken when separating the substrate into devices.

The protrusions 54 of this embodiment decrease the light emerging in the horizontal direction (the direction of side face of the nitride semiconductor light emitting device) and increase the light directed upward. Especially in a small-sized device, as the second region occupies a greater proportion of the area, there remains a smaller area where light is emitted with a high intensity. The area of high intensity of light emission can be increased by forming the protrusions 54 in the second region.

In this embodiment, it is preferable to separate the substrate into individual devices by laser scribing described in Embodiment 2. With the laser scribing, it is made possible to form the back-side region 2b of the side face of the substrate in an inclined configuration, so as to increase the efficiency of extracting light at the end face of the substrate. As a result, the protrusions 54 and the inclined surface (the back-side region 2b) formed on the side face of the substrate cooperate to direct the light upward thereby to increase the efficiency of extracting light at the periphery of the device where light tends to be weak.

Embodiment 9

Figure 16:
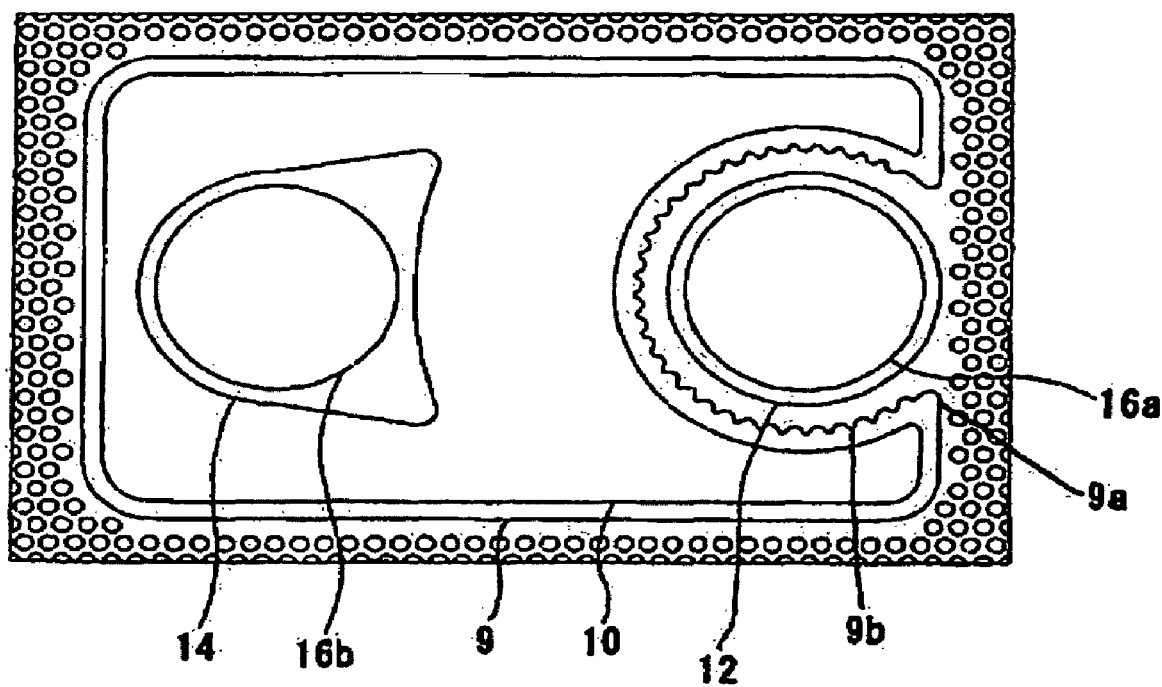
FIG. 16 is a sectional view of a nitride semiconductor light emitting device according to a ninth embodiment of the present invention.

FIG. 16 is a top view of the nitride semiconductor light emitting device according to this embodiment. In this embodiment, a plurality of protrusions 9a are provided to the p-side layer 9 in the region that surrounds the n-side pad electrode 12 of Embodiment 8. Formation of the protrusions 9a increases the first region where current flows to emit light. Moreover, as the protrusions 9a are formed so as to taper off, light is caused to undergo diffuse reflection at the end face of the protrusions 9a, thereby improving the efficiency of extracting light. Furthermore, as the taper angle of the end face in the distal end portion of the protrusion 9a becomes smaller, the efficiency of extracting light becomes higher in this region.

EXAMPLE 1

A nitride semiconductor light emitting device having the structure shown in FIG. 1 and FIG. 2 are made. Specifically, (a) A buffer layer made of AlGaN (not shown), (b) non-doped GaN layer (not shown), (c) an n-side cladding layer of super lattice structure comprising an n-side contact layer made of Si-doped GaN, GaN layers (40 Å) and InGaN layers (20 Å) stacked alternately one on another for 10 layers each as the n-side nitride semiconductor layer 4, (d) the active layer 6 of multiple quantum well-structure consisting of three to six GaN layers (250 Å) and three, to six InGaN layers (30 Å), stacked alternately, and (e) a p-side contact layer of super lattice structure consisting of two Mg-doped GaN layers (40 Å) and two Mg-doped InGaN layers (25 Å) stacked alternately and a p-side contact layer made of Mg-doped GaN as the p-side nitride semiconductor layer 8, which are stacked one on another in this order on a sapphire substrate 2.

The p-side nitride semiconductor layer 8, the active layer 6 and a part 4" of the n-side nitride semiconductor layer (namely the p-side layer 9) are removed so as to expose the surface of the n-side nitride semiconductor layer 4'. This process is carried out by etching so that the taper angle of the end face of the p-side layer 9 in a region located on the side of the tangent 20 opposite to the p-side pad electrode 14 becomes small. The n-side pad electrode 12 is formed on the n-side layer 4' that has been exposed. Then the light transmitting electrode 10 is formed from ITO on substantially the entire surface of the p-side nitride semiconductor layer 8, and the p-side pad electrode 14 is formed on part of the light transmitting electrode 10. In this process, etching is carried out so that the taper angle of the end face of the light transmitting electrode 10 in a region located on the side of the tangent 20 opposite to the p-side pad electrode 14 becomes small.

Now the embodiment will be described in more detail.
<Formation of Semiconductor Layers>
A substrate made of sapphire 2 inches in diameter and having C plane as the principal surface is placed in an MOCVD reaction vessel of which temperature is set to 500° C., to form a buffer layer made of $Al_{0.1}Ga_{0.9}N$ by using trimethyl gallium (TMG), trimethyl aluminum (TMA) and ammonia ($NH_3$) to a thickness of 1.5 Å. After growing the buffer layer, temperature is changed to 1050° C. and an undoped GaN is grown by using TMG and ammonia to a thickness of 1.5 μm. This layer acts as a base layer (growth substrate) for the growth of each layer that constitutes the device structure.

Then an n-side contact layer is formed from GaN doped with $1\times10^{18}/cm^3$ of Si to a thickness of 2.165 μm on the base layer as the n-side nitride semiconductor layer 4 at 1050° C. using TMG, ammonia, and silane gas as the impurity gas. Then with the temperature set to 800° C., an n-type cladding layer of super lattice structure is grown to a thickness of 640 Å by stacking GaN layer (40 Å) and InGaN layer (20 Å) alternately one on another ten times while intermittently supplying trimethyl indium as the stock material gas. In addition, the active layer 6 of multiple quantum well structure is grown by stacking GaN layer (250 Å) and InGaN layer (30 Å) alternately one on another three to six times.

A p-type cladding layer of super lattice structure is grown to a thickness of 0.2 μm by stacking Mg-doped $Al_{0.1}Ga_{0.9}N$ layer (40 Å) and Mg-doped InGaN layer (20 Å) alternately one on another ten times as the p-side nitride semiconductor layer 8. Last, p-side contact layer made of p-type GaN doped with $1.5\times10^{20}/cm^3$ of Mg is formed to a thickness of 0.5 μm on the p-type cladding layer by introducing 4 ml of TMG, 3.0 liters of ammonia and 2.5 liters of hydrogen gas as the carrier gas in hydrogen atmosphere at 900° C. Then the substrate thus processed is annealed in nitrogen atmosphere at 600° C. in a reaction vessel, so as to further reduce the resistance of the p-type cladding layer and the p-side contact layer.

<Etching>

The annealed substrate is taken out of the reaction vessel, a mask of a predetermined shape is formed oh the surface of the uppermost p-side contact layer, to form the end portion 9a of tapering-off shape (W/L ratio about 1.2) at a position located away from the p-side pad electrode 14 of the p-side layer 9. The p-side layer 9 is etched so that the distal end portion 9a has a smaller taper angle than the other distal end portion, so as to expose a part of the n-side contact layer. In this case, the taper angle of the end face of the end portion 9a of tapering-off shape is about 27 degrees.

<Formation of p Electrode and n Electrode>

After removing the mask, the substrate is placed in a sputtering apparatus and oxide target made of sintered materials of $In_2O_3$ and $SnO_2$ is placed in the sputtering apparatus. Sputtering is carried out with RF power of 10 W/cm² for 20 minutes then 2 W/cm² for 20 minutes using a mixed gas of argon gas and oxygen (20:1) as the sputtering gas in oxygen atmosphere, so as to form the light transmitting electrode 10 from ITO to a thickness of 5000 Å. After forming the light transmitting electrode 10, a mask having a distal end portion of tapering-off shape (W/L ratio about 0.86) at a position located away from the p-side pad electrode 14. Etching is carried out over the mask to make the taper angle of the end face to about 60 degrees in the distal end portion 10a of tapering-off shape.

Then a mask having a predetermined pattern is formed from resist on the light transmitting electrode 10, then a W layer, a Pt layer and an Au layer are formed thereon, so as to form the p-side pad electrode 14 for bonding to total thickness of 1 μm by lift-off process. Then the n-side pad electrode 12 made of Rh/Pt/Au is formed on the n-type contact layer to a thickness of 7000 Å. Then heat treatment is carried out at a temperature from 400 to 600 degrees in an annealing apparatus.

The substrate is separated at predetermined positions to obtain the nitride semiconductor light emitting device 1. The nitride semiconductor light emitting device thus obtained has the highest intensity of light emission in a region interposed between the p-side pad electrode and the h-side pad electrode. The taper angle of the end face of the distal end portions 9a and 10a of tapering-off shape formed in the p-side layer 9 and the light transmitting electrode 10 is made smaller than the taper angle of the end face of the p-side layer 9 and the light transmitting electrode 10 in the region of the highest intensity of light emission. Therefore, light directed upward from this end face can be increased to improve the uniformity of light emission, and the efficiency of extracting light can also be improved.

EXAMPLE 2

The taper angle of the light transmitting electrode 10 in a region interposed between the p-side pad electrode and the n-side pad electrode is made 110 degrees by adjusting the conditions (etching liquid, gas, etc.) of etching the light transmitting electrode in Example 1. With other respects, this example is similar to Example 1. In this example, concentration of light emission to the end face of the light transmitting electrode 10 in the region interposed between the p-side pad electrode and the n-side pad electrode is mitigated compared to Example 1.

COMPARATIVE EXAMPLE 1

Rate of etching the p-side layer 9 and the light transmitting electrode 10 is made higher in Example 1, so as to obtain substantially the same taper angle of end face of 9.0 degrees over the entire circumference of the p-side layer 9 and the light transmitting electrode 10. With other respects, the nitride semiconductor light emitting device is made similarly to Example 1. The intensity of light emission in a region located away from the p-side pad electrode becomes lower than in Example 1.

EXAMPLE 3

When forming the mask used for etching the p-side layer 9, the mask is left to remain so that a plurality of semi-circular protrusions 9b are formed in a region that surrounds the n-electrode 12 and a plurality of circular protrusions 54 are formed between the p-side layer 9 and the circumference of the device (the second region), as shown in FIG. 16. The protrusions 54 are formed in round shape having diameter of 5 μm and are arranged at intervals of 7 μm between the centers of the protrusions 54. The protrusions 54 are arranged in two or three rows disposed along the periphery of the device, so that the protrusions 54 in an even-numbered row and the protrusions 54 in an odd-numbered row are located at positions staggered by half pitch relative to each other. With other respects, the nitride semiconductor light emitting device is made similarly to Example 1. The taper angles of end faces of the semi-circular protrusions 9b and the circular protrusions 54 are 75 degrees.

The nitride semiconductor light emitting device of this example has the efficiency of extracting light higher than that of Example 1 due to the protrusions 54 and the protrusions 9b. Also because the formation of the semicircular protrusions 9b makes the space between the n-side pad electrode 12 and the p-side layer 9 smaller than the space between circumference of the device and the p-side layer 9 (namely the first region), the area of the first region where current flows to emit light increases and the efficiency of emitting light is increased.

EXAMPLE 4

The substrate is separated into individual devices by laser scribing for the nitride semiconductor light emitting device of Example 1. With other respects, this example is similar to Example 1.

First, after the nitride semiconductor light emitting device is formed similarly to Example 1, the sapphire substrate 2 is ground on the back surface to a thickness of 85 µm. Then the sapphire substrate 2 is fastened onto the adhesive sheet 40 with the back side facing up. The sapphire substrate 2 is irradiated with YAG laser beam having a wavelength of 355 nm and diameter of 5 µm on the back surface, so as to form separation grooves having width of about 10 µm on the surface and depth of about 47 µm. The sapphire substrate 2 is sand blasted to remove deposit that has solidified after melting and remained in the separation grooves. The sand blast process employs $Al_2O_3$ having, particle size of about 4 µm. Then the sapphire substrate 2 is separated into individual chips by roller breaking on the back. The chip size is set to 150 µm in shorter side and 250 µm in longer side.

The nitride semiconductor light emitting device that is made as described above has the side face of the sapphire substrate inclined in the region of about 47 µm on the back surface side as shown in FIG. 9. The taper angle (the angle between the inclined surface 2*b* and the principal surface of the substrate) is about 6 degrees. The inclined side face has the effect of improving the efficiency of extracting light on the periphery of the device.

EXAMPLE 5

The nitride semiconductor light emitting device is made similarly to Example 4 except for carrying put the sand blast process after roller breaking.

In Example 4, after the laser scribing and roller breaking processes, the space between the devices is enlarged by expanding the adhesive layer 40. The sapphire substrate 2 is sand-blasted on the back side, using abrasive particles made of $Al_2O_3$ having particle size of 40 µm. Since larger abrasive particles are used than in Example 4 the sand blast process can be completed in a shorter period of time. In the nitride semiconductor light emitting device obtained in this way has the denatured layer of the back side 2*b* of the side face of the sapphire substrate 2 removed more satisfactorily than in Example 4. The side face of the sapphire substrate 2 has inclined back side 2*b* improving the efficiency of extracting light oh the periphery of the device. The back side 2*b* of the side face of the sapphire substrate 2 has surface roughness of about 1.1 µm, two times the surface roughness (about 0.5 µm) of the back surface of the sapphire substrate 2.

What is claimed is:

1. A nitride semiconductor light emitting device comprising:
    a substrate,
    an n-side nitride semiconductor layer and a p-side nitride semiconductor layer formed on said substrate,
    a light transmitting electrode formed on said p-side nitride semiconductor layer,
    a p-side pad electrode formed on said p-side nitride semiconductor layer for connection with an outside circuit, and
    an n-side pad electrode for connection of the n-side nitride semiconductor layer with the outside circuit,
    wherein end faces of said light transmitting electrode have non-uniform taper angles,
    wherein a side face of said substrate is perpendicular to a principal surface of the substrate in a region on the semiconductor layer side, and is inclined to the principal surface of the substrate in a region on the back side thereof, and
    wherein a width X of the p-side nitride semiconductor layer connected with said p-side pad electrode and a maximum width $R_p$ of said p-side pad electrode in a direction of shorter side of the substrate satisfy a relation of inequality $X<2R_p$.

2. The nitride semiconductor light emitting device according to claim 1, wherein a plurality of protrusions made of nitride semiconductor are formed between said light transmitting electrode and the periphery of the device.

3. The nitride semiconductor light emitting device according to claim 1, wherein surface roughness of the side face of said substrate on said semiconductor layer side is smaller than that on the back side of said substrate.

4. The nitride semiconductor light emitting device according to claim 1, wherein the taper angle in a region of lowest intensity of light emission is made smaller than that in a region of highest intensity of light emission.

5. The nitride semiconductor light emitting device according to claim 1, wherein, with respect to a centerline connecting the center of the n-side pad electrode and the center of the p-side pad electrode and a tangent line of the n-side pad electrode crossing the centerline at right angles, the taper angles of end faces of said light transmitting electrode are made smaller in a region located on the opposite side of said p-side pad electrode across the tangent line than in other regions.

6. The nitride semiconductor light emitting device according to claim 4, wherein the taper angle is set larger than 70 degrees in the region of highest intensity of light emission and is set to 70 degrees or smaller in the region of lowest intensity of light emission.

7. The nitride semiconductor light emitting device according to claim 1, wherein the taper angle is set to 70 degrees or less at a position most distant from said p-side pad electrode.

8. The nitride semiconductor light emitting device according to claim 1, wherein said light transmitting electrode has a tapering-off-shaped end portion in a region of relatively low intensity of light emission when viewed from above the substrate, and the taper angle of said end portion is smaller than the taper angle in the region of highest intensity of light emission.

9. A nitride semiconductor light emitting device comprising:
    a substrate,
    an n-side nitride semiconductor layer and a p-side nitride semiconductor layer formed on said substrate,
    a light transmitting electrode formed on said p-side nitride semiconductor layer,
    a p-side pad electrode formed on said p-side nitride semiconductor layer for connection with an outside circuit, and
    an n-side pad electrode for connection of the n-side nitride semiconductor layer with the outside circuit,
    wherein end faces of said p-side nitride semiconductor layer have non-uniform taper angles,
    wherein a side face of said substrate is perpendicular to a principal surface of the substrate in a region on the semiconductor layer side, and is inclined to the principal surface of the substrate in a region on the back side thereof, and wherein a width X of the p-side nitride semiconductor layer connected with said p-side pad electrode and a maximum width $R_p$ of said p-side pad electrode in a direction of shorter side of the substrate satisfy a relation of inequality $X<2R_p$.

10. The nitride semiconductor light emitting device according to claim 9, wherein a plurality of protrusions made of nitride semiconductor are formed between said light transmitting electrode and the periphery of the device.

11. The nitride semiconductor light emitting device according to claim 9, wherein surface roughness of the side face of said substrate on said semiconductor layer side is smaller than that on the back side of said substrate.

12. The nitride semiconductor light emitting device according to claim 9, wherein the taper angle in a region of lowest intensity of light emission is made smaller than that in a region of highest intensity of light emission.

13. The nitride semiconductor light emitting device according to claim 9, wherein, with respect to a centerline connecting the center of the n-side pad electrode and the center of the p-side pad electrode and a tangent line of the n-side pad electrode crossing the centerline at right angles, the taper angles of end faces of said p-side nitride semiconductor layer are made smaller in a region located on the opposite side of said p-side pad electrode across the tangent line than in other regions.

14. The nitride semiconductor light emitting device according to claim 12, wherein the taper angle is set larger than 70 degrees in the region of highest intensity of light emission and is set to 70 degrees or smaller in the region of lowest intensity of light emission.

15. The nitride semiconductor light emitting device according to claim 9, wherein the taper angle is set to 70 degrees or less at a position most distant from said p-side pad electrode.

16. The nitride semiconductor light emitting device according to claim 9, wherein said p-side nitride semiconductor layer has a tapering-off-shaped end portion in a region of relatively low intensity of light emission when viewed from above the substrate, and the taper angle of said end portion is smaller than the taper angle in the region of highest intensity of light emission.

17. The nitride semiconductor light emitting device according to claim 9, wherein end faces of said light transmitting electrode have non-uniform taper angles.

* * * * *